United States Patent
Imoto et al.

(10) Patent No.: US 9,472,676 B2
(45) Date of Patent: Oct. 18, 2016

(54) SEMICONDUCTOR DEVICE AND MANUFACTURING METHOD THEREOF

(75) Inventors: Yuki Imoto, Atsugi (JP); Tetsunori Maruyama, Atsugi (JP); Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 704 days.

(21) Appl. No.: 13/422,251

(22) Filed: Mar. 16, 2012

(65) Prior Publication Data

US 2012/0241738 A1   Sep. 27, 2012

(30) Foreign Application Priority Data

Mar. 25, 2011 (JP) ................. 2011-067498

(51) Int. Cl.
H01L 29/786 (2006.01)
H01L 27/32 (2006.01)
H01L 51/05 (2006.01)

(52) U.S. Cl.
CPC ....... *H01L 29/7869* (2013.01); *H01L 27/3274* (2013.01); *H01L 51/0545* (2013.01)

(58) Field of Classification Search
CPC .................................................. H01L 27/3274
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 5,923,963 A | 7/1999 | Yamanaka |
| 6,191,452 B1 | 2/2001 | Oda et al. |

(Continued)

FOREIGN PATENT DOCUMENTS

| | | |
|---|---|---|
| CN | 101540341 A | 9/2009 |
| CN | 101728000 A | 6/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Mohammad Choudhry
(74) *Attorney, Agent, or Firm* — Eric J. Robinson; Robinson Intellectual Property Law Office, P.C.

(57) ABSTRACT

A semiconductor device having excellent electric characteristics and a method for manufacturing the semiconductor device are provided. A method for manufacturing a semiconductor device includes the steps of: forming a gate electrode; forming a gate insulating film to cover the gate electrode; forming an oxide semiconductor film over the gate insulating film; forming a hydrogen permeable film over the oxide semiconductor film; forming a hydrogen capture film over the hydrogen permeable film; performing heat treatment to release hydrogen from the oxide semiconductor film; forming a source electrode and a drain electrode to be in contact with a part of the oxide semiconductor film; and removing an exposed portion of the hydrogen capture film to form a channel protective film formed of the hydrogen permeable film. A semiconductor device manufactured by the above method is also provided.

14 Claims, 12 Drawing Sheets

(56) References Cited

U.S. PATENT DOCUMENTS

| | | |
|---|---|---|
| 6,294,274 B1 | 9/2001 | Kawazoe et al. |
| 6,380,014 B1 | 4/2002 | Ohta et al. |
| 6,391,690 B2 | 5/2002 | Miyasaka |
| 6,555,419 B2 | 4/2003 | Oda et al. |
| 6,563,174 B2 | 5/2003 | Kawasaki et al. |
| 6,660,572 B2 | 12/2003 | Miyasaka |
| 6,727,522 B1 | 4/2004 | Kawasaki et al. |
| 6,803,265 B1 | 10/2004 | Ngo et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,132,716 B2 | 11/2006 | Moon et al. |
| 7,211,825 B2 | 5/2007 | Shih et al |
| 7,268,405 B2 | 9/2007 | Park et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,326,605 B2 | 2/2008 | Choi et al. |
| 7,374,998 B2 | 5/2008 | Hergenrother et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,459,220 B2 | 12/2008 | Hikmet et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,538,343 B2 | 5/2009 | Nam |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,791,072 B2 | 9/2010 | Kumomi et al. |
| 7,791,074 B2 | 9/2010 | Iwasaki |
| 7,821,012 B2 | 10/2010 | Jinbo |
| 7,875,539 B2 | 1/2011 | Yamaguchi et al. |
| 7,910,457 B2 | 3/2011 | Yamazaki |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 8,018,012 B2 | 9/2011 | Nakagawa et al. |
| 8,084,343 B2 | 12/2011 | Yamaguchi et al. |
| 8,154,024 B2 | 4/2012 | Iwasaki |
| 8,158,979 B2 | 4/2012 | Kang et al. |
| 8,207,538 B2 | 6/2012 | Jinbo |
| 8,378,393 B2 | 2/2013 | Sakata et al. |
| 8,384,076 B2 | 2/2013 | Park et al. |
| 8,384,078 B2 | 2/2013 | Kang et al. |
| 8,426,852 B2 | 4/2013 | Lee et al. |
| 8,450,144 B2 | 5/2013 | Sakata et al. |
| 8,461,597 B2 | 6/2013 | Kim et al. |
| 8,492,862 B2 | 7/2013 | Yamazaki et al. |
| 8,518,740 B2 | 8/2013 | Yamazaki et al. |
| 9,012,904 B2 | 4/2015 | Imoto et al. |
| 9,012,918 B2 | 4/2015 | Yamazaki et al. |
| 2001/0002323 A1 | 5/2001 | Kobayashi et al. |
| 2001/0002325 A1 | 5/2001 | Oda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0229443 A1 | 11/2004 | Bower |
| 2005/0017302 A1 | 1/2005 | Hoffman |
| 2005/0116233 A1 | 6/2005 | Park et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091451 A1 | 5/2006 | Yamaguchi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0192915 A1 | 8/2006 | Kimura |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292774 A1 | 12/2006 | Chen et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0184619 A1 | 8/2007 | Hergenrother et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1* | 10/2008 | Park et al. .............. 257/43 |
| 2008/0258143 A1 | 10/2008 | Kim et al. |
| 2008/0272370 A1 | 11/2008 | Endo et al. |
| 2008/0283916 A1 | 11/2008 | Yamazaki |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0184305 A1 | 7/2009 | Lee et al. |
| 2009/0184396 A1 | 7/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0302481 A1 | 12/2009 | Matsuzaki |
| 2009/0305461 A1 | 12/2009 | Akimoto et al. |
| 2009/0309102 A1 | 12/2009 | Kim et al. |
| 2010/0006810 A1 | 1/2010 | Kim et al. |
| 2010/0045179 A1 | 2/2010 | Sano et al. |
| 2010/0051938 A1 | 3/2010 | Hayashi et al. |

(56) References Cited

U.S. PATENT DOCUMENTS

| | | |
|---|---|---|
| 2010/0065844 A1 | 3/2010 | Tokunaga |
| 2010/0084655 A1* | 4/2010 | Iwasaki et al. ............... 257/43 |
| 2010/0092800 A1 | 4/2010 | Itagaki et al. |
| 2010/0109002 A1 | 5/2010 | Itagaki et al. |
| 2010/0109058 A1 | 5/2010 | Sakata et al. |
| 2010/0136743 A1 | 6/2010 | Akimoto et al. |
| 2010/0233847 A1 | 9/2010 | Ohara et al. |
| 2010/0244020 A1 | 9/2010 | Sakata et al. |
| 2010/0244029 A1 | 9/2010 | Yamazaki et al. |
| 2010/0276694 A1 | 11/2010 | Sakakura et al. |
| 2010/0283049 A1 | 11/2010 | Sato et al. |
| 2010/0295041 A1 | 11/2010 | Kumomi et al. |
| 2011/0003418 A1 | 1/2011 | Sakata et al. |
| 2011/0006299 A1 | 1/2011 | Abe et al. |
| 2011/0009697 A1 | 1/2011 | Kawano et al. |
| 2011/0031497 A1 | 2/2011 | Yamazaki et al. |
| 2011/0053322 A1 | 3/2011 | Sasaki et al. |
| 2011/0068335 A1 | 3/2011 | Yamazaki et al. |
| 2011/0079777 A1 | 4/2011 | Akimoto |
| 2011/0101330 A1 | 5/2011 | Kang et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127519 A1 | 6/2011 | Kang et al. |
| 2011/0133176 A1 | 6/2011 | Lee et al. |
| 2011/0136302 A1 | 6/2011 | Yamazaki et al. |
| 2011/0140097 A1* | 6/2011 | Cheong et al. ............... 257/43 |
| 2011/0140205 A1 | 6/2011 | Sakata et al. |
| 2011/0163311 A1 | 7/2011 | Akimoto et al. |
| 2011/0175080 A1 | 7/2011 | Kim et al. |
| 2011/0204246 A1 | 8/2011 | Tanaka et al. |
| 2011/0220893 A1 | 9/2011 | Kim et al. |
| 2012/0132907 A1 | 5/2012 | Yamazaki et al. |
| 2012/0241736 A1 | 9/2012 | Imoto et al. |
| 2012/0241737 A1 | 9/2012 | Imoto et al. |
| 2012/0244659 A1 | 9/2012 | Imoto et al. |
| 2013/0264564 A1 | 10/2013 | Park et al. |
| 2013/0285044 A1 | 10/2013 | Yuan et al. |
| 2013/0328044 A1 | 12/2013 | Yamazaki et al. |
| 2015/0214379 A1 | 7/2015 | Yamazaki et al. |

FOREIGN PATENT DOCUMENTS

| | | |
|---|---|---|
| CN | 101944485 A | 1/2011 |
| EP | 1737044 A | 12/2006 |
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-250295 A | 9/2004 |
| JP | 2004-273614 A | 9/2004 |
| JP | 2004-273732 A | 9/2004 |
| JP | 2006-156952 A | 6/2006 |
| JP | 2006-165528 | 6/2006 |
| JP | 2007-005527 A | 1/2007 |
| JP | 2007-096055 | 4/2007 |
| JP | 2007-123861 | 5/2007 |
| JP | 2008-141119 | 6/2008 |
| JP | 2010-183108 A | 8/2010 |
| JP | 2010-251731 A | 11/2010 |
| JP | 2010-251735 A | 11/2010 |
| JP | 2011142311 | 7/2011 |
| JP | 2012-216792 A | 11/2012 |
| WO | WO-2004/114391 | 12/2004 |
| WO | WO-2007/029844 | 3/2007 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium May 20, 2008, vol. 39, No. 1, pp. Digest 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Material), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4): a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No, 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201210093069.4) Dated Nov. 30, 2015.

* cited by examiner

SEMICONDUCTOR DEVICE AND MANUFACTURING METHOD THEREOF

BACKGROUND OF THE INVENTION

1. Field of the Invention

The present invention relates to a semiconductor device including an oxide semiconductor film and a manufacturing method thereof.

In this specification, a semiconductor device refers to all devices which can function by utilizing semiconductor characteristics; an electro-optical device, a semiconductor circuit, and an electronic apparatus are all included in the category of the semiconductor device.

2. Description of the Related Art

In recent years, transistors which are used for many liquid crystal display devices and light-emitting display devices typified by flat panel displays have been formed over glass substrates and using a silicon semiconductor such as amorphous silicon or polycrystalline silicon.

Instead of the silicon semiconductor, a technique in which an oxide semiconductor that is metal oxide having semiconductor characteristics is used for transistors has attracted attention.

For example, techniques in which a transistor manufactured using zinc oxide which is single-component metal oxide or In—Ga—Zn—O-based oxide which is a homologous compound as an oxide semiconductor is used as a switching element or the like of a pixel of a display device, is disclosed (see Patent Document 1 to Patent Document 3).

REFERENCE

Patent Documents

[Patent Document 1] Japanese Published Patent Application No. 2006-165528
[Patent Document 2] Japanese Published Patent Application No. 2007-096055
[Patent Document 3] Japanese Published Patent Application No. 2007-123861

When an oxide semiconductor film is formed, hydrogen that is not a constituent element of the oxide semiconductor film enters the oxide semiconductor film in some cases. Part of hydrogen in the oxide semiconductor film serves as a donor to cause generation of electrons that are carriers, which increases conductivity of the oxide semiconductor film. As described above, when hydrogen enter the oxide semiconductor film and conductivity is increased, a problem arises in semiconductor characteristics of the oxide semiconductor film.

For example, in a transistor in which an oxide semiconductor film containing hydrogen and having increased conductivity is used for a channel formation region, the following problem occurs: the threshold voltage is shifted in the negative direction, and accordingly the drain current flows in a state where no voltage is applied to a gate electrode ($V_{gs}$=0 V). Note that in this specification, the drain current refers to a current flowing between a source electrode and a drain electrode. Furthermore, in this specification, the phenomenon in which the drain current flows in a state where no voltage is applied to the gate electrode ($V_{gs}$=0 V) is called normally-on.

In view of the above problems, an object of one embodiment of the present invention is to provide a semiconductor device having excellent electric characteristics and a method for manufacturing the semiconductor device.

SUMMARY OF THE INVENTION

The technical idea of the present invention is that in a transistor including an oxide semiconductor film, which is a semiconductor device, a film having a hydrogen permeable property (a hydrogen permeable film) is formed in contact with the oxide semiconductor film, a film having a hydrogen capture property (a hydrogen capture film) is formed in contact with the hydrogen permeable film, hydrogen contained in the oxide semiconductor film is released by heat treatment, and the hydrogen passes through the hydrogen permeable film and is transferred to the hydrogen capture film. Note that the hydrogen is captured by the hydrogen capture film.

One embodiment of the present invention is a method for manufacturing a semiconductor device, including the steps of: forming a gate electrode; forming a gate insulating film to cover the gate electrode; forming an oxide semiconductor film over the gate insulating film; forming a hydrogen permeable film and a hydrogen capture film in this order over the oxide semiconductor film; performing heat treatment, so that hydrogen is released from the oxide semiconductor film; forming a source electrode and a drain electrode to be in contact with part of the oxide semiconductor film; and removing part of the hydrogen capture film overlapping with a channel formation region in the oxide semiconductor film, so that a channel protective film formed of the hydrogen permeable film is formed.

A semiconductor device manufactured in the above method includes a gate electrode, a gate insulating film covering the gate electrode, an oxide semiconductor film over the gate insulating film, a channel protective film formed of a hydrogen permeable film over the oxide semiconductor film, a hydrogen capture film in contact with part of the channel protective film, and a source electrode and a drain electrode in contact with part of the channel protective film, part of the hydrogen capture film, and part of the oxide semiconductor film.

A film containing oxide can be used as the hydrogen permeable film which is to be the channel protective film. Therefore, one embodiment of the present invention is a method for manufacturing a semiconductor device, including the steps of: forming a gate electrode; forming a gate insulating film to cover the gate electrode; forming an oxide semiconductor film over the gate insulating film; forming a hydrogen permeable film containing oxide and a hydrogen capture film in this order over the oxide semiconductor film; performing heat treatment, so that hydrogen is released from the oxide semiconductor film and oxygen is supplied from the hydrogen permeable film to the oxide semiconductor film; forming a source electrode and a drain electrode to be in contact with part of the oxide semiconductor film; and removing part of the hydrogen capture film overlapping with a channel formation region in the oxide semiconductor film, so that a channel protective film formed of the hydrogen permeable film is formed.

A semiconductor device manufactured in the above method includes a gate electrode, a gate insulating film covering the gate electrode, an oxide semiconductor film over the gate insulating film, a channel protective film formed of a hydrogen permeable film containing oxide over the oxide semiconductor film, a hydrogen capture film in contact with part of the channel protective film, and a source electrode and a drain electrode in contact with part of the channel protective film, part of the hydrogen capture film, and part of the oxide semiconductor film.

In the above structure, the shape of the hydrogen capture film may be the same as the shape of the source and drain electrodes. Therefore, one embodiment of the present invention is a method for manufacturing a semiconductor device, including the steps of: forming a gate electrode; forming a gate insulating film to cover the gate electrode; forming an oxide semiconductor film over the gate insulating film; forming a channel protective film formed of a hydrogen permeable film; forming a hydrogen capture film in contact with part of the oxide semiconductor film; performing heat treatment, so that hydrogen is released from the oxide semiconductor film; forming a conductive film; and removing part of the conductive film and part of the hydrogen capture film which overlap with a channel formation region in the oxide semiconductor film so that a source electrode and a drain electrode are formed.

A semiconductor device manufactured in the above method includes a gate electrode, a gate insulating film covering the gate electrode, an oxide semiconductor film over the gate insulating film, a channel protective film formed of a hydrogen permeable film over the oxide semiconductor film, a hydrogen capture film in contact with part of the channel protective film, part of the oxide semiconductor film, and part of the gate insulating film, and a source electrode and a drain electrode in contact with hydrogen capture film.

A film containing oxide can be used as the hydrogen permeable film which is to be the channel protective film. One embodiment of the present invention is a method for manufacturing a semiconductor device, including the steps of: forming a gate electrode; forming a gate insulating film to cover the gate electrode; forming an oxide semiconductor film over the gate insulating film; forming a channel protective film formed of a hydrogen permeable film containing oxide; forming a hydrogen capture film in contact with part of the oxide semiconductor film; performing heat treatment, so that hydrogen is released from the oxide semiconductor film and oxygen is supplied from the hydrogen permeable film to the oxide semiconductor film; forming a conductive film; and removing part of the conductive film and part of the hydrogen capture film which overlap with a channel formation region in the oxide semiconductor film so that a source electrode and a drain electrode are formed.

A semiconductor device manufactured in the above method includes a gate electrode, a gate insulating film covering the gate electrode, an oxide semiconductor film over the gate insulating film, a channel protective film formed of a hydrogen permeable film containing oxide over the oxide semiconductor film, a hydrogen capture film in contact with part of the channel protective film, part of the oxide semiconductor film, and part of the gate insulating film, and a source electrode and a drain electrode in contact with hydrogen capture film.

A main component which is a metal element included in the hydrogen capture film is the same as a main component which is a metal element included in the oxide semiconductor film. The hydrogen permeable film does not include the metal element as a main component. Further, since a film containing oxide can be used as the hydrogen permeable film, the hydrogen permeable film can be a silicon oxide film and the hydrogen capture film can be an oxynitride film containing indium (In). Note that in this specification, a silicon oxynitride film indicates a film in which the amount of oxygen is larger than that of nitrogen. Further, in this specification, an oxynitride film containing In indicates a film in which In is contained and the amount of oxygen is larger than that of nitrogen, and particularly indicates a film formed by nitriding an oxide material.

Therefore, one embodiment of the present invention is a method for manufacturing a semiconductor device, including the steps of: forming a gate electrode; forming a gate insulating film to cover the gate electrode; forming an oxide semiconductor film over the gate insulating film; forming a silicon oxide film and an oxynitride film containing In in this order over the oxide semiconductor film; performing heat treatment, so that hydrogen is released from the oxide semiconductor film; forming a source electrode and a drain electrode to be in contact with part of the oxide semiconductor film; and removing part of the oxynitride film containing In overlapping with a channel formation region in the oxide semiconductor film, so that a channel protective film is formed.

A semiconductor device manufactured in the above method includes a gate electrode; a gate insulating film covering the gate electrode; an oxide semiconductor film over the gate insulating film; a channel protective film formed of a silicon oxide film or a silicon oxynitride film over the oxide semiconductor film; an oxynitride film containing indium in contact with a part of the channel protective film; and a source electrode and a drain electrode in contact with a part of the channel protective film, a part of the oxynitride film containing indium, and a part of the oxide semiconductor film.

In the above structure, the shape of the hydrogen capture film may be the same as the shape of the source and drain electrodes. Therefore, one embodiment of the present invention is a method for manufacturing a semiconductor device, including the steps of: forming a gate electrode; forming a gate insulating film to cover the gate electrode; forming an oxide semiconductor film over the gate insulating film; forming a channel protective film formed of a silicon oxide film or a silicon oxynitride film; forming an oxynitride film containing indium in contact with part of the oxide semiconductor film; performing heat treatment, so that hydrogen is released from the oxide semiconductor film; forming a conductive film; and removing part of the conductive film and part of the oxynitride film containing indium which overlap with a channel formation region in the oxide semiconductor film so that a source electrode and a drain electrode are formed.

A semiconductor device manufactured in the above method includes a gate electrode; a gate insulating film covering the gate electrode; an oxide semiconductor film over the gate insulating film; a channel protective film formed of a silicon oxide film or a silicon oxynitride film over the oxide semiconductor film; an oxynitride film containing indium in contact with part of the channel protective film, part of the oxide semiconductor film, and part of the gate insulating film; and a source electrode and a drain electrode in contact with the oxynitride film containing indium.

The oxide semiconductor film can be formed using an In—Ga—Zn—O-based material which is a three-component metal oxide, and the oxynitride film containing In can be formed by nitriding the In—Ga—Zn—O-based material. Note that in this specification, an oxide semiconductor film formed using an In—Ga—Zn—O-based material is referred to as an IGZO film (In—Ga—Zn—O film), and an oxynitride film formed by nitriding the In—Ga—Zn—O-based material is referred to as an IGZON film (In—Ga—Zn—O—N film).

Further, it is preferable that the hydrogen permeable film be formed thin so that hydrogen released from the oxide semiconductor film by heat treatment efficiently diffuses (penetrates). Specifically, in the case where the hydrogen permeable film is a silicon oxide film or a silicon oxynitride film, the film thickness is greater than or equal to 0.5 nm and less than or equal to 15 nm, preferably greater than or equal to 2 nm and less than or equal to 5 nm.

In a semiconductor device which is one embodiment of the present invention and a method for manufacturing the semiconductor device, hydrogen exists in an oxide semiconductor film is released by heat treatment, and the hydrogen passes through a hydrogen permeable film and is captured by a hydrogen capture film. In other words, the heat treatment enables hydrogen contained in the oxide semiconductor film to transfer to the hydrogen capture film. Therefore, the oxide semiconductor film in the semiconductor device is an oxide semiconductor film whose hydrogen content is reduced. Further, with use of a film containing oxide (e.g., silicon oxide film or silicon oxynitride film) as the hydrogen permeable film, oxygen can be supplied to the oxide semiconductor film by the heat treatment, whereby oxygen deficiency in the oxide semiconductor film can be reduced.

According to one embodiment of the present invention, a semiconductor device including an oxide semiconductor film in which the hydrogen concentration and oxygen deficiency are reduced can be provided. The oxide semiconductor film has excellent semiconductor characteristics; therefore, according to one embodiment of the present invention, a semiconductor device having excellent electric characteristics can be provided.

DETAILED DESCRIPTION OF THE INVENTION

Figure 1A:
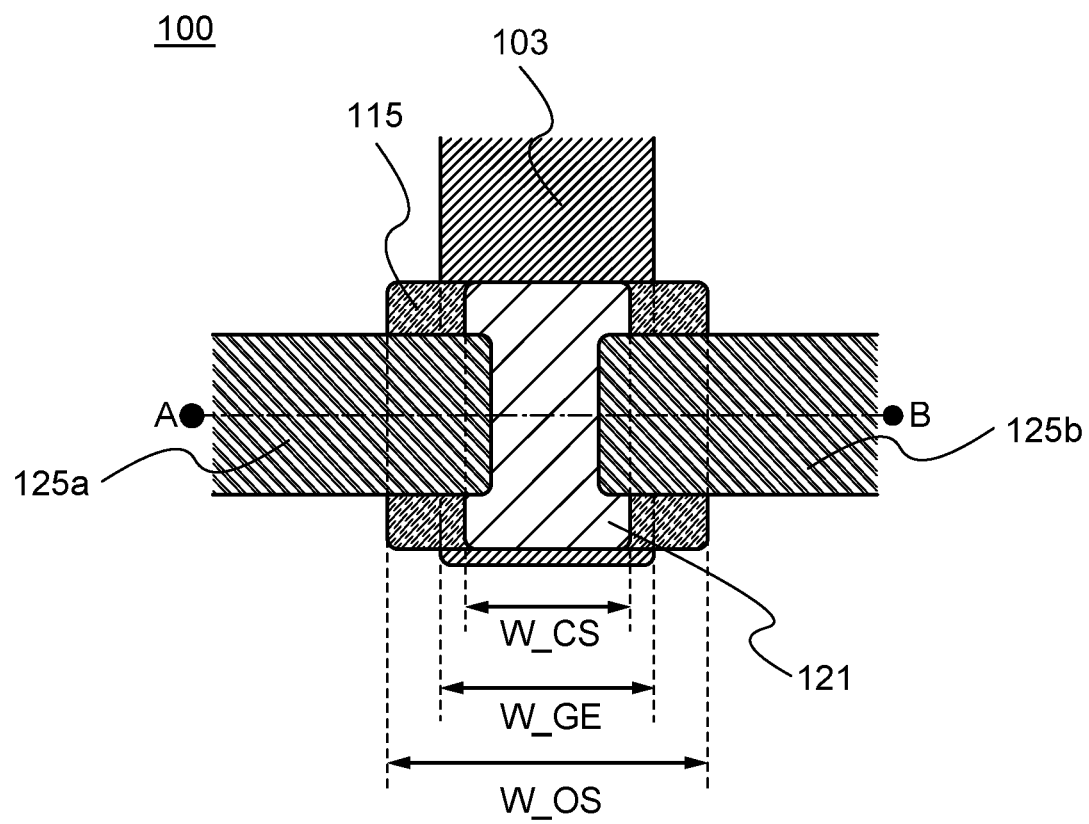
FIGS. 1A and 1B are a top view and a cross-sectional view of a semiconductor device which is one embodiment of the present invention.

Embodiments of the present invention will be described below with reference to the accompanying drawings. However, the invention is not limited to the description below, and it is easily understood by those skilled in the art that the mode and detail can be changed in various ways unless departing from the scope and spirit of the present invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Note that functions of "source" and "drain" may be switched to each other in the case where a direction of a current flow is changed during circuit operation, for example. Therefore, the terms "source" and "drain" can be used to denote the drain and the source, respectively, in this specification.

In this specification, in the case where etching is performed using a resist mask, the resist mask is removed after the etching even there is no description of removal of the resist mask in this specification.

Note that in this specification, "on-state current" is current which flows between a source and a drain when a transistor is in a conduction state. For example, in the case of an n-channel thin film transistor, the on-state current is current which flows between a source and a drain when the gate voltage of the transistor is higher than the threshold voltage thereof. In addition, "off-state current" is current which flows between a source and a drain without intention when a transistor is in a non-conduction state. For example, in the case of an n-channel thin film transistor, the off-state current is current which flows between a source and a drain when the gate voltage of the transistor is lower than the threshold voltage thereof.

(Embodiment 1)

In this embodiment, a semiconductor device which is one embodiment of the present invention will be described. Here, a transistor will be described as an example of the semiconductor device. The transistor may have a top-contact structure or a bottom-contact structure as long as it has a bottom-gate structure. A bottom-gate top-contact transistor will be described as an example in this embodiment.

Figure 1B:
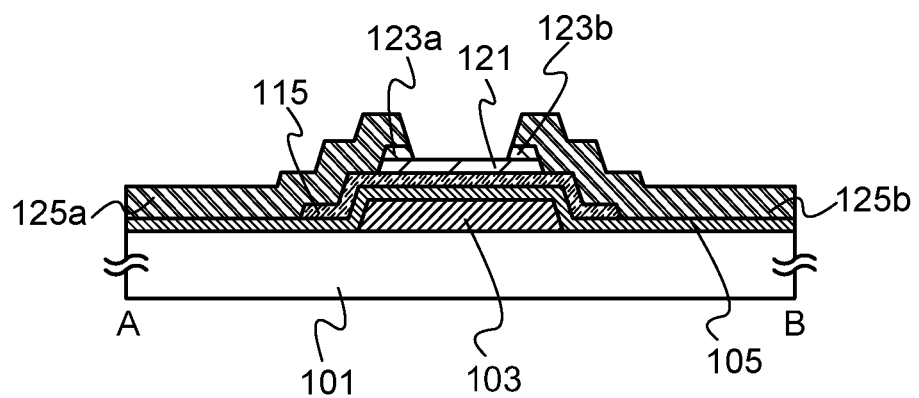

FIG. 1A is the top view of a transistor 100. FIG. 1B is the cross-sectional view taken along the alternate long and short dashed line A-B in FIG. 1A.

The transistor 100 includes a gate electrode 103 over a substrate 101, a gate insulating film 105 covering the gate electrode 103, an oxide semiconductor film 115 over the gate insulating film 105, a channel protective film 121 formed of a film having a hydrogen permeable property (a hydrogen permeable film) over the oxide semiconductor film 115, a source electrode 125*a* and a drain electrode 125*b* in contact with part of the oxide semiconductor film 115, and films each having a hydrogen capture property (hydrogen capture films) 123*a* and 123*b* between the channel protective film 121 and the source and drain electrodes 125*a* and 125*b*. Note that the gate insulating film 105 is not shown in FIG. 1A for clarity. Ends of the hydrogen capture films 123*a* and 123*b* have taper angles in FIG. 1B, but the taper angles of the hydrogen capture films 123*a* and 123*b* are not shown in FIG. 1A for clarity. In the transistor according to one embodiment of the present invention, in addition to the channel protective film formed over a channel formation region, an insulating film may be formed over the channel protective film to cover ends of the oxide semiconductor film.

The transistor 100 has a bottom-gate structure, in which the gate electrode 103 is provided over the substrate 101. Further, the transistor 100 has a top-contact structure, in which the source and drain electrodes 125*a* and 125*b* are provided in contact with part of a top surface of the oxide semiconductor film 115.

In the transistor 100, the hydrogen capture film 123*a* is formed in a region where the gate electrode 103, the oxide semiconductor film 115, the channel protective film 121, and the source electrode 125*a* overlap with one another, and the hydrogen capture film 123*b* is formed in a region where the gate electrode 103, the oxide semiconductor film 115, the channel protective film 121, and the drain electrode 125*b* overlap with one another.

The hydrogen capture films 123*a* and 123*b* are formed simultaneously with formation of the source and drain electrodes 125*a* and 125*b* with use of the same resist mask, so that the hydrogen capture films 123*a* and 123*b* are separately provided.

In the transistor 100 in FIGS. 1A and 1B, although the width W_OS of the oxide semiconductor film 115 is larger than the width W_GE of the gate electrode 103, the width W_OS of the oxide semiconductor film 115 may be smaller than the width W_GE of the gate electrode 103. Such a structure can prevent exposure to light which enters from the rear surface of the substrate 101 (e.g., visible light and ultraviolet light); thus, deterioration of electric characteristics caused by irradiation of the light can be reduced in the completed transistor 100. Note that as examples of the deterioration of electric characteristics caused by irradiation of the light, negative shift of threshold voltage and an increase in off-state current are given.

The oxide semiconductor film 115 serves as a channel formation region of the transistor 100. The channel protective film 121 is provided over the oxide semiconductor film 115, so that the channel length of the transistor 100 corresponds to the width W_CS of the channel protective film 121. Providing the channel protective film 121 can prevent the oxide semiconductor film 115 from being etched during formation of the source and drain electrodes 125*a* and 125*b*. Consequently, a defect caused by such etching can be suppressed; thus, the completed transistor 100 can have favorable electric characteristics.

A method for manufacturing the transistor 100 will be described below with reference to FIGS. 2A to 2D and FIGS. 3A to 3C.

There is no particular limitation on a material and the like of a substrate 101 as long as the material has heat resistance high enough to withstand at least heat treatment performed later. For example, a glass substrate, a ceramic substrate, a quartz substrate, a sapphire substrate, or the like can be used as the substrate 101. Further alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates provided with a semiconductor element may be used as the substrate 101. Moreover, a substrate which is formed using a metal material to have conductivity and on which an insulating film is formed may be used.

A flexible substrate may also be used as the substrate 101. In the case where a transistor is provided over a flexible substrate, an oxide semiconductor film according to one embodiment of the present invention may be directly formed on the flexible substrate. Alternatively, an oxide semiconductor film which has been formed over another substrate (substrate different from the flexible substrate) may be separated and transferred to the flexible substrate. Note that in order to separate the oxide semiconductor film and transfer it to the flexible substrate, it is preferable that a region where separation easily occurs be provided between the different substrate and the oxide semiconductor film.

A conductive film is formed over the substrate 101 to have a single layer structure or a stacked structure with use of a conductive material applicable to the gate electrode 103. Examples of the conductive material include a single metal such as aluminum, titanium, chromium, nickel, copper, yttrium, zirconium, molybdenum, silver, tantalum, and tungsten and an alloy containing any of these metals as a main component. For example, a single layer structure of an aluminum film containing silicon, a two-layer structure in which a titanium film is formed over an aluminum film, a two-layer structure in which a titanium film is formed over a tungsten film, a two-layer structure in which a copper film is formed over a copper-magnesium-aluminum alloy film, and a three-layer structure in which a titanium film, an aluminum film, and a titanium film are stacked in this order are given. Further, a transparent conductive material including indium oxide, tin oxide, or zinc oxide may be used.

A resist mask is formed over the conductive film formed with use of the conductive material by a photolithography process, and then the conductive film is etched into a desired shape with use of the resist mask to form the gate electrode 103. Note that the resist mask can be formed by an ink-jet method, a printing method, or the like as appropriate, as well as by the photolithography process. The etching may be either dry etching or wet etching. The conductive film is preferably processed so that an end of the gate electrode 103 has a taper angle. This is because with the gate electrode having a taper angle, the coverage with a film to be formed in the subsequent steps after this step in the process for manufacturing the transistor 100 can be improved and disconnection of the film can be prevented.

The gate electrode 103 also has the function of a gate wiring. The thickness of the gate electrode 103 can be determined as appropriate depending on the electric resistance of the above conductive material and a period of time for the manufacturing step. For example, the thickness of the gate electrode 103 may be greater than or equal to 10 nm and less than or equal to 500 nm.

In the transistor 100, a base insulating film may be provided between the substrate 101 and the gate electrode 103. The base insulating film prevents diffusion of an impurity (e.g., an alkali metal such as Li or Na) from the substrate 101 and etching of the substrate 101 during the formation of the gate electrode 103. The base insulating film may be formed to have a thickness of 50 nm or more with use of a material applicable to the gate insulating film 105 which is described later.

Next, the gate insulating film 105 is formed over the gate electrode 103. As a material applicable to the gate insulating film 105, any of insulating films selected from oxide insulating films such as a silicon oxide film, a gallium oxide film, and an aluminum oxide film; nitride insulating films such as a silicon nitride film and an aluminum nitride film; a silicon oxynitride film; an aluminum oxynitride film; and a silicon nitride oxide film can be used. Note that the gate insulating film 105 preferably contains oxygen in a portion in contact with the oxide semiconductor film 107 formed later.

In this specification, silicon oxynitride refers to a substance that contains more oxygen than nitrogen, and silicon nitride oxide refers to a substance that contains more nitrogen than oxygen.

An aluminum nitride film, an aluminum nitride oxide film, and a silicon nitride film which have high thermal conductivity are particularly effective in improving thermal dissipation of the transistor 100 when used for the gate insulating film 105.

Since an alkali metal such as Li or Na is an impurity in the manufacturing process of the transistor 100, the amount thereof is preferably small. In the case where a glass substrate containing an impurity such as an alkali metal is used as the substrate 101, the above nitride insulating film is preferably formed as the gate insulating film 105 in order to prevent entry of an alkali metal.

Note that in the case of using the above-described nitride insulating film as the gate insulating film 105, a region in the gate insulating film 105, which is in contact with the oxide semiconductor film 107 to be formed later, preferably contains oxygen; thus, the oxide insulating film may be stacked over the nitride insulating film.

In addition, since the gate insulating film 105 preferably contains oxygen in a portion in contact with the oxide semiconductor film 107 formed later, an insulating film from which oxygen is released by heating may be used as the gate insulating film 105. Note that the expression "oxygen is released by heating" means that the amount of released oxygen which is converted into oxygen atoms is greater than or equal to $1.0 \times 10^{18}$ cm$^{-3}$, preferably greater than or equal to $3.0 \times 10^{20}$ cm$^{-3}$, in thermal desorption spectrometry (TDS) analysis.

A method for quantifying the amount of released oxygen which is converted into oxygen atoms, with the use of TDS analysis is described below.

The amount of released gas in TDS analysis is proportional to the integral value of ion intensity. Therefore, the amount of released gas can be calculated from the ratio between the integral value of measured ion intensity and the reference value of a standard sample. The reference value of a standard sample refers to the ratio of the predetermined density of atoms contained in the sample to the integral value of ion intensity.

For example, the number of the released oxygen molecules ($N_{O2}$) from an insulating film can be found according to Numerical Expression 1 with the TDS analysis results of a silicon wafer containing hydrogen at a predetermined density which is the standard sample and the TDS analysis results of the insulating film. Here, all ion intensity at a mass number of 32 which are obtained by the TDS analysis is assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2} = N_{H2}/S_{H2} \times S_{O2} \times \alpha \quad \text{(Numerical Expression 1)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Japanese Published Patent Application No. H6-275697 can be referred to for details of Numerical Expression 1. Note that the above value of the amount of released oxygen is obtained by measurement with a thermal desorption spectrometer produced by ESCO Ltd., EMD-WA1000S/W using a silicon wafer containing hydrogen atoms at $1 \times 10^{16}$ cm$^{-3}$ as the standard sample.

Further, in the TDS analysis, part of released oxygen is detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. In the insulating film, the amount of released oxygen when converted into oxygen atoms is twice the number of the released oxygen molecules.

As an example of the insulating film from which oxygen is released by heating, a film of oxygen-excess silicon oxide ($SiO_X$ (X>2)) is given. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry. Note that in this embodiment, a film of oxygen-excess silicon oxide described above is used as the gate insulating film 105.

Next, the oxide semiconductor film 107 is formed over the gate insulating film 105. The oxide semiconductor film 107 is formed with use of metal oxide having semiconductor characteristics. A material having a band gap of 2.5 eV or higher, preferably 3.0 eV or higher is selected for the oxide semiconductor film 107 in order to decrease the off-state current of the transistor 100. Note that a material exhibiting semiconductor characteristics and having a band gap in the above range may be used, instead of the metal oxide having semiconductor characteristics. There is no particular limitation on crystallinity of the oxide semiconductor film 107, and an amorphous oxide semiconductor film, a single-crystal oxide semiconductor film, a polycrystalline oxide semiconductor film, or the like can be used.

The oxide semiconductor film 107 may be a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in a vicinity of a surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

The oxide semiconductor film 107 may be formed by a sputtering method, a molecular beam epitaxy method, an atomic layer deposition method, or a pulsed laser deposition method. In consideration of the type of film to be formed and the formation time thereof, the oxide semiconductor film 107 may be formed to have a desired thickness. The thickness may be, for example, greater than or equal to 10 nm and less than or equal to 100 nm, preferably greater than or equal to 10 nm and less than or equal to 30 nm.

As metal oxide having semiconductor characteristics which can be used for the oxide semiconductor film 107, the following materials can be given. For example, four-component metal oxide such as an In—Sn—Ga—Zn—O-based material; three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; one-component metal oxide such as an In—O-based material, a Sn—O-based material, or a Zn—O-based material; or the like may be used. Here, for example, an In—Ga—Zn—O-based material means oxide containing indium (In), gallium (Ga), and zinc (Zn), and there is no particular limitation on the composition ratio.

In the case where an In—Ga—Zn—O-based material is used for the oxide semiconductor film 107, a material with a composition ratio where $In_2O_3:Ga_2O_3:ZnO=1:1:1$ [molar ratio] can be used as an example of a metal oxide target containing In, Ga, and Zn. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used.

In the case where an In—Zn—O-based material is used as the oxide semiconductor film 107, the atomic ratio of In to Zn is higher than or equal to 0.5 and lower than or equal to 50, preferably higher than or equal to 1 and lower than or equal to 20, further preferably higher than or equal to 1.5 and lower than or equal to 15. When the atomic ratio of In to Zn is in the above range, the field-effect mobility of the transistor 100 can be improved. Here, when the atomic ratio of the compound is In:Zn:O=X:Y:Z, the relation $Z>1.5X+Y$ is preferably satisfied.

Further, the In—Zn—O-based material may contain an element other than In, Ga, and Zn. For example, a material represented by a chemical formula, $InMO_3(ZnO)_m$ (m>0) may be used as the oxide semiconductor film 107. Here, M represents one or more metal elements selected from Ga, Al, Mn, and Co. For example, M may be Ga, Ga and Al, Ga and Mn, Ga and Co, or the like.

Here, a method for forming a CAAC-OS film in the oxide semiconductor film 107 will be described.

There are two methods for forming a CAAC-OS film as following: (1) one of the methods is that formation of an oxide semiconductor film is performed once while the substrate is heated; (2) the other of the methods is that the formation of the oxide semiconductor film is divided into twice, and heat treatment is performed after each formation of the oxide semiconductor film.

First, the case of forming a CAAC-OS film by the method (1) will be described.

The oxide semiconductor film 107 is formed over the gate insulating film 105 while the substrate 101 is heated. Note that the oxide semiconductor film 107 may be formed by a sputtering method, a molecular beam epitaxy method, an atomic layer deposition method, or a pulsed laser deposition method, as described above.

The temperature at which the substrate 101 is heated is set so that the temperature of the substrate 101 is higher than or equal to 150° C. and lower than or equal to 450° C., and preferably the temperature of the substrate 101 is higher than or equal to 200° C. and lower than or equal to 350° C.

The temperature of the substrate 101 during the formation of the oxide semiconductor film 107 is set to high, so that a CAAC-OS film in which the proportion of the crystal part to the amorphous part is high can be formed in the oxide semiconductor film 107.

Next, the case of forming a CAAC-OS film by the method (2) will be described.

While the temperature of the substrate 101 is kept at a temperature higher than or equal to 200° C. and lower than or equal to 400° C., an oxide semiconductor film as a first layer (first oxide semiconductor film) is formed over the gate insulating film 105, and then heat treatment is performed at a temperature higher than or equal to 550° C. and lower than the strain point of the substrate 101 in an atmosphere of nitrogen, oxygen, a rare gas, or dry air. By the heat treatment, a crystalline region (including plate-like crystal) is formed in a region including a top surface of the first oxide semiconductor film. Then, an oxide semiconductor film as a second layer (a second oxide semiconductor film) is formed thicker than the first oxide semiconductor film. After that, heat treatment is performed again at a temperature higher than or equal to 550° C. and lower than the strain point of the substrate 101. By the heat treatment, crystal growth occurs upwardly with use of the first oxide semiconductor film including a crystalline region (including plate-like crystal) as a seed for the crystal growth, and accordingly the whole region including a top surface of the second oxide semiconductor film is crystallized. Note that the first oxide semiconductor film and the second oxide semiconductor film may be formed using the metal oxide material which can be applied to the oxide semiconductor film 107. The thickness of the first oxide semiconductor film is preferably greater than or equal to 1 nm and less than or equal to 10 nm.

Note that the same metal element as a metal element for forming the oxide semiconductor film 107 is preferably included in a hydrogen capture film that is formed later, and further, the hydrogen capture film is preferably an oxynitride film containing In. Thus, as the oxide semiconductor film 107 in this embodiment, an IGZO film is formed using an In—Ga—Zn—O-based material by the method (1) (and a sputtering method). Therefore, the IGZO film is a CAAC-OS film.

Although hydrogen in the oxide semiconductor film 107 can be released by heat treatment performed later, the concentration of hydrogen contained in the oxide semiconductor film 107 is preferably reduced as much as possible when the oxide semiconductor film 107 is formed. Specifically, when the oxide semiconductor film 107 is formed by a sputtering method, for reducing the hydrogen concentration, oxygen, a high-purity rare gas (typically, argon) from which impurities such as hydrogen, water, a hydroxyl group, or a hydride is removed, or a mixed gas of a rare gas and oxygen may be used as appropriate as an atmosphere gas supplied to a treatment chamber of a sputtering apparatus. Furthermore, for evacuation of the treatment chamber, a combination of a cryopump having high capability in evacuating water and a sputter ion pump having high capability in evacuating hydrogen may be used.

With use of the above sputtering apparatus and the sputtering method, the oxide semiconductor film 107 in which the amount of contained hydrogen is small can be formed. Note that even when the sputtering apparatus and the sputtering method are used, the oxide semiconductor film 107 contains more than a little nitrogen. For example, the nitrogen concentration of the oxide semiconductor film 107, which is measured by secondary ion mass spectrometry (SIMS) is lower than $5 \times 10^{18}$ atoms$^{-3}$.

Figure 2A:
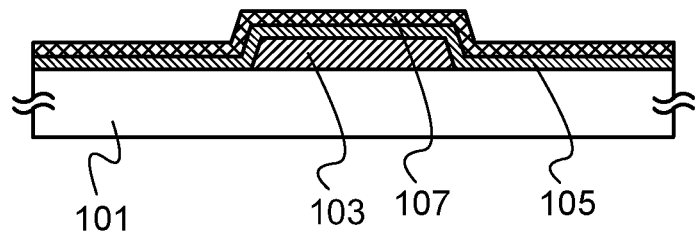
FIGS. 2A to 2D are cross-sectional views illustrating a method for manufacturing a semiconductor device which is one embodiment of the present invention.

The structure obtained through the steps up to here is illustrated in FIG. 2A.

A hydrogen permeable film 109 is formed over the oxide semiconductor film 107. The hydrogen permeable film 109 functions as a film through which hydrogen released from the oxide semiconductor film 107 by heat treatment performed later diffuses (penetrates). Since the hydrogen permeable film 109 is processed into the channel protective film 121 in the subsequent manufacturing step, the hydrogen permeable film 109 is formed with use of an insulating film. As a method for forming the hydrogen permeable film 109, in addition to a method such as a sputtering method which can be used for formation of the oxide semiconductor film 107, a plasma CVD method may be used.

The channel protective film 121 which is formed by processing the hydrogen permeable film 109 has the function of keeping the oxide semiconductor film serving as a channel formation region (particularly the surface of the oxide semiconductor film) clean in the process for manufacturing the transistor 100. Specifically, since the hydrogen permeable film 109 is provided over the oxide semiconductor film 107 in the process for manufacturing the transistor 100, a defect, which is caused by dry etching performed in the subsequent manufacturing steps after this step, and contamination by an organic substance can be prevented. As a result, the completed transistor 100 can have favorable electric characteristics.

Here, a state in which the amount of oxygen is small as compared with oxygen of the stoichiometric proportion in the oxide semiconductor, i.e., oxygen deficiency (oxygen vacancies) in the oxide semiconductor, is described. During or after formation of an oxide semiconductor film, electric charge is generated owing to oxygen deficiency in the oxide semiconductor film in some cases. Part of oxygen vacancies in the oxide semiconductor generally serves as a donor, which causes generation of electrons serving as a carrier and results in an increase in conductivity of the formed oxide semiconductor film. Accordingly, semiconductor characteristics of the formed oxide semiconductor film are degraded. In a transistor including an oxide semiconductor film with oxygen deficiency, deterioration of electric characteristics, such as negative shift of threshold voltage and an increase in off-state current, occurs.

Thus, a film containing oxide is used for the hydrogen permeable film 109, whereby by heat treatment which is performed later, hydrogen can be released from the oxide semiconductor film 107 and oxygen can be supplied to the oxide semiconductor film 107. By supplying oxygen to the oxide semiconductor film 107, oxygen deficiency in the oxide semiconductor film 107 is reduced and generation of electrons serving as a carrier is suppressed accordingly. Specifically, a silicon oxide film or a silicon oxynitride film can be used as the film containing oxide.

Further, it is preferable that the hydrogen permeable film 109 be formed thin so that hydrogen released from the oxide semiconductor film 107 by heat treatment performed later efficiently diffuses (penetrates). Specifically, in the case where the hydrogen permeable film 109 is a silicon oxide film or a silicon oxynitride film, the thickness may be greater than or equal to 0.5 nm and less than or equal to 15 nm, preferably greater than or equal to 2 nm and less than or equal to 5 nm.

Note that in this embodiment, as the hydrogen permeable film 109, a silicon oxide film is formed to a thickness of 5 nm by a sputtering method.

Next, a hydrogen capture film 111 is formed over the hydrogen permeable film 109. The hydrogen capture film 111 is a film functioning to capture hydrogen which has been released from the oxide semiconductor film 107 by heat treatment and has diffused (penetrated) through the hydrogen permeable film 109. There is no particular limitation on a film which is applied to the hydrogen capture film 111 as long as the film has the above function, and for example, a conductive film, an insulating film, or a semiconductor film can be used. As a method for forming the hydrogen capture film 111, in addition to a method such as a sputtering method which can be used for formation of the oxide semiconductor film 107, a plasma CVD method may be used.

In particular, the hydrogen capture film 111 is preferably an oxynitride film containing In. For example, the oxynitride film containing In is a film formed using at least indium nitride and one or more materials of indium oxide, gallium oxide, zinc oxide, tin oxide, aluminum oxide, tungsten oxide, molybdenum oxide, titanium oxide, tantalum oxide, and silicon oxide. Further, the nitrogen concentration in the hydrogen capture film 111 is higher than or equal to 0.01 at. % and lower than 7 at. %, or higher than or equal to 7 at. % and lower than or equal to 20 at. %.

Further, the hydrogen capture film 111 is not limited to a semiconductor film as long as it is a film functioning to capture hydrogen which has been diffused (penetrated) through the hydrogen permeable film 109. A conductive film, or an insulating film can be used, for example. For example, an oxynitride film containing indium nitride whose nitrogen concentration is greater than or equal to 0.01 atomic % and less than 7 atomic % has a high insulating property. An oxynitride film containing indium nitride whose nitrogen concentration is greater than or equal to 7 atomic % and less than or equal to 20 atomic % has a high conductivity in some cases when bonding to hydrogen. Note that the nitrogen concentration in the hydrogen capture film 111 can be quantified by X-ray photoelectron spectroscopy (XPS) analysis.

The oxynitride film containing In, which is described as an example of the hydrogen capture film 111, may be provided between the gate electrode 103 and the gate insulating film 105. Part of hydrogen contained in the oxynitride film containing In generates electrons serving as carriers. Since an electron has negative charge, an electric field is generated in a manner similar to the case where a negative bias is applied from the gate electrode, so that the threshold voltage of the transistor is shifted in the positive direction. The hydrogen concentration in the oxynitride film containing In can be controlled by control of the nitrogen concentration in the oxynitride film containing In. Note that the hydrogen concentration in the oxynitride film can be quantified by SIMS, and is set to greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. The hydrogen concentration in the oxynitride film is set to be in the above range, whereby negative shift of the threshold voltage of the transistor can be suppressed.

In the case where the oxynitride film containing In used for the hydrogen capture film 111 is formed by a sputtering method, a target including at least indium oxide is used and a nitriding gas is supplied. As the target, in addition to indium oxide, a material including at least one of gallium oxide, zinc oxide, tin oxide, aluminum oxide, tungsten oxide, molybdenum oxide, titanium oxide, tantalum oxide, and silicon oxide may be used. The nitriding gas contains at least nitrogen and may further contain at least one of a rare gas (such as helium, neon, argon, krypton, or xenon) and oxygen, in addition to nitrogen.

In particular, a main component of metal elements included in the oxide semiconductor film 107 may be the same as a main component of metal elements included in the hydrogen capture film 111, and thus, the hydrogen capture film 111 can be formed using a metal oxide material the same as that included in the oxide semiconductor film 107. Therefore, in the case where the oxide semiconductor film 107 is obtained by nitriding the IGZO film, the hydrogen capture film 111 can be an IGZON film which is a nitrided IGZO film. Note that the IGZON film can be obtained by forming an IGZO film while nitrogen is supplied in a treatment chamber of an apparatus for formation of the IGZO film.

Further, in consideration of the type of film to be formed and the formation time thereof, the hydrogen capture film 111 may be formed to have a desired thickness. However, the hydrogen capture film 111 is preferably formed thick enough to efficiently capture hydrogen released from the oxide semiconductor film 107. Specifically, the thickness thereof may be greater than or equal to 10 nm and less than or equal to 500 nm.

Note that in this embodiment, as the hydrogen capture film 111, an IGZON film is formed to a thickness of 100 nm by a sputtering method.

The gate insulating film 105, the oxide semiconductor film 107, the hydrogen permeable film 109, and the hydrogen capture film 111 may be formed successively in vacuum. For example, after impurities including hydrogen attached on surfaces of the substrate 101 and the gate electrode 103 are removed by heat treatment or plasma treatment, the gate insulating film 105 may be formed without being exposed to air and continuously, the oxide semiconductor film 107, the hydrogen permeable film 109, and the hydrogen capture film 111 may also be formed without being exposed to air. By successive film formation as the above, impurities including hydrogen attached on the surfaces of the substrate 101 and the gate electrode 103 can be reduced. In addition, in the stack of the substrate 101, the gate electrode 103, the gate insulating film 105, the oxide semiconductor film 107, the hydrogen permeable film 109, and the hydrogen capture film 111, an atmospheric component can be prevented from attaching to each interface between the layers. As a result, hydrogen released from the oxide semiconductor film 107 by heat treatment performed later can be efficiently made to diffuse (penetrate) and captured. Moreover, the completed transistor 100 can have favorable electric characteristics.

Figure 2B:
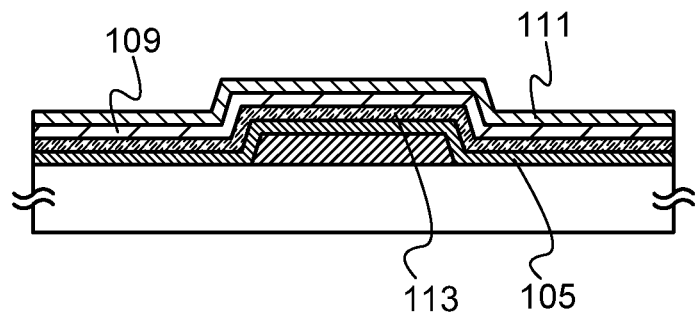

Next, heat treatment is performed on a structure obtained through the steps up to here. By performing heat treatment, hydrogen included in the oxide semiconductor film 107 can be released. The released hydrogen penetrates the hydrogen permeable film 109 and is captured by the hydrogen capture film 111. In other words, by performing the heat treatment, hydrogen included in the oxide semiconductor film 107 can be transferred to the hydrogen capture film 111. Therefore, by the heat treatment, a highly purified oxide semiconductor film 113 in which the hydrogen concentration is reduced is formed. The structure obtained through the steps up to here is illustrated in FIG. 2B.

In addition, the hydrogen permeable film 109 is formed between the oxide semiconductor film 107 and the hydrogen capture film 111, whereby the oxide semiconductor film 107 and the hydrogen capture film 111 are provided separately from each other. For example, in the case where the hydrogen capture film 111 is provided directly on the oxide semiconductor film 107, some of hydrogen released from the oxide semiconductor film 107 by heat treatment is left at an interface between the oxide semiconductor film 107 and the hydrogen capture film 111 without being captured by the hydrogen capture film 111, in some cases. However, when the hydrogen permeable film 109 is provided between the oxide semiconductor film 107 and the hydrogen capture film 111, hydrogen released from the oxide semiconductor film 107 by heat treatment can be transferred to the hydrogen capture film 111 without being left in the oxide semiconductor film 107, and accordingly the hydrogen concentration in the oxide semiconductor film 107 can be sufficiently reduced.

In the case of forming the hydrogen capture film 111 directly on the oxide semiconductor film 107, hydrogen remains at the interface between the oxide semiconductor film 107 and the hydrogen capture film 111, and the hydrogen serves as a donor, which causes an increase in off-state current of the completed transistor 100. Providing the hydrogen permeable film 109 between the oxide semiconductor film 107 and the hydrogen capture film 111 makes it possible to transfer hydrogen released from the oxide semiconductor film 107 to the hydrogen capture film 111 without hydrogen remaining in the oxide semiconductor film 107. Moreover, providing the hydrogen permeable film 109 (to be the channel protective film 121 in a later step) having an insulating property makes it possible to suppress an increase in off-state current of the completed transistor 100.

The temperature of the heat treatment is higher than 450° C. and lower than the strain point of the substrate 101, preferably, higher than or equal to 500° C. and lower than the strain point of the substrate 101, further preferably higher than or equal to 550° C. and lower than the strain point of the substrate 101. As the temperature is increased, the amount of hydrogen released from the oxide semiconductor film 107 is increased. Further, as the thickness of the oxide semiconductor film 107 formed over the substrate 101 is decreased, the temperature can be lowered.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The hydrogen concentration of the oxide semiconductor film 113 formed by the heat treatment is lower than $1 \times 10^{19}$ $cm^{-3}$, preferably lower than or equal to $5 \times 10^{18}$ $cm^{-3}$. Note that the hydrogen concentration in the oxide semiconductor film 113 is a value that can be quantified by SIMS. In the oxide semiconductor film 113, the amount of hydrogen serving as a donor is reduced, and generation of electrons serving as a carrier is suppressed; thus the oxide semiconductor film 113 has favorable semiconductor characteristics.

Since a silicon oxide film or a silicon oxynitride film is used as the hydrogen permeable film 109, by the heat treatment, oxygen is supplied to the oxide semiconductor film 113 from the silicon oxide film or the silicon oxynitride film, so that the oxygen deficiency is reduced. Further, in this embodiment, the oxygen-excess silicon oxide film, which is an example of a film from which oxygen is released by heating, is used as the gate insulating film 105, so that oxygen is also supplied from the oxygen-excess silicon oxide film by the heat treatment, whereby the oxide semiconductor film 113 whose oxygen deficiency is reduced is formed.

In the oxide semiconductor film 113, the hydrogen concentration and the oxygen deficiency are reduced by the heat treatment; therefore, generation of electrons which serve as carriers is suppressed in the oxide semiconductor film 113. Consequently, negative shift of the threshold voltage is suppressed in the transistor 100 including the oxide semiconductor film 113, thereby achieving a transistor whose normally-on characteristics are suppressed.

Further, the interface level between the gate insulating film 105 and the oxide semiconductor film 113 and the interface level between the oxide semiconductor film 113 and the hydrogen permeable film 117 can be reduced by the heat treatment. In the thus manufactured transistor 100, charges generated in accordance with operation can be prevented from being captured at each interface. In this manner, the transistor 100 can be a transistor with less deterioration of electric characteristics.

In the case where the oxide semiconductor film 113 (before the heat treatment, the oxide semiconductor film 107) is a CAAC-OS film whose hydrogen concentration is reduced, the channel formation region (the oxide semiconductor film 115 to be formed later) in the completed transistor 100 is formed of a CAAC-OS film whose hydrogen concentration is reduced. Therefore, the transistor 100 can be a highly reliable transistor with stable electric characteristics in which shift of threshold voltage between before and after irradiation of light (visible light or ultraviolet light) and between before and after a gate bias-temperature (BT) stress test is small.

In the oxide semiconductor film 113, hydrogen concentration is sufficiently reduced (highly purified) and enough oxygen is supplied by the heat treatment, a defect level in the band gap caused by oxygen deficiency is reduced. As a result, the off-state current of the transistor 100 including the oxide semiconductor film 113 is reduced. Specifically, the off-state current at room temperature (25° C.) (here, the value of a transistor having a channel length of 3 µm and a channel width of 1 µm) is 100 zA (1 zA (zeptoampere) is $1 \times 10^{-21}$ A) or lower, preferably 10 zA or lower. Since alkali metal such as Li or Na is an impurity, the amount of the alkali metal which enters the transistor is preferably reduced. The concentration of the alkali metal in the oxide semiconductor film 113 (the oxide semiconductor film 115 to be formed later) is lower than or equal to $2 \times 10^{16}$ $cm^{-3}$, preferably, lower than or equal to $1 \times 10^{15}$ $cm^{-3}$. Further, the content of alkaline earth metal is preferably low because alkaline earth metal is also an impurity.

A resist mask is formed over the hydrogen capture film 111 through a photolithography process, and the oxide semiconductor film 113, the hydrogen permeable film 109, and the hydrogen capture film 111 are etched into a desired shape with use of the resist mask, so that an oxide semiconductor film 115, the hydrogen permeable film 117, and the hydrogen capture film 119 are formed. Note that the range of the hydrogen concentration in the oxide semiconductor film 115 is the range of the hydrogen concentration in the oxide semiconductor film 113. Note that the resist mask can be formed by an ink-jet method, a printing method, or the like as appropriate, as well as through the photolithography step. For the etching, either wet etching or dry etching may be employed, and the etching is preferably performed so that ends of the oxide semiconductor film 115, the hydrogen permeable film 117, and the hydrogen capture film 119 each have a taper angle. With the taper angle of ends of the oxide semiconductor film 115, the hydrogen permeable film 117, and the hydrogen capture film 119, in the manufacturing process of the transistor 100, coverage with a film which is formed after this etching step can be improved, and disconnection of the film can accordingly be prevented. In the case of performing dry etching, the taper angle can be formed by performing etching while the resist mask is made to recede.

As an etching gas used in dry etching for forming the oxide semiconductor film 115, the hydrogen permeable film 117, and the hydrogen capture film 119, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)) can be used.

Figure 2C:
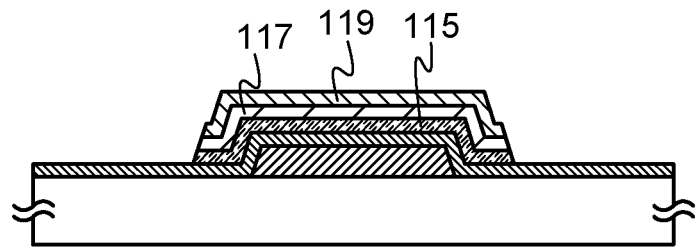

As for the etching in this step, since component materials of the oxide semiconductor film 113 in a state before the etching and the gate insulating film 105 are different from each other, etching rates thereof are also different from each other. Accordingly, with a condition of high etching selectivity of the oxide semiconductor film 113 to the gate insulating film 105 and consideration for the end point in the oxide semiconductor film 113, the oxide semiconductor film 115, the hydrogen permeable film 117, and the hydrogen capture film 119 are formed. Note that the structure obtained through the steps up to here is illustrated in FIG. 2C.

Next, a resist mask is formed over the hydrogen capture film 119 through a photolithography process, and etching is performed to form a desired shape with use of the resist mask so that the channel protective film 121 and the hydrogen capture film 123 which is obtained by reducing the size of the hydrogen capture film 119 are formed over the oxide semiconductor film 115. Note that the channel protective film 121 is composed of the same material as the hydrogen permeable film 117. The resist mask can be formed by an ink-jet method, a printing method, or the like as appropriate, as well as through the photolithography process. The etching may be either dry etching or wet etching, and preferably performed so that ends of the channel protective film 121 and the hydrogen capture film 123 have taper angles. Formation of the taper angles of the ends of the channel protective film 121 and the hydrogen capture film 123 lead to improvement in coverage with a film to be formed in the subsequent steps after this step in the process for manufacturing the transistor 100 and prevention of disconnection of the film. In the case of using dry etching, the taper angle can be obtained by etching while the resist mask is reduced in size.

In the case of forming the channel protective film 121 and the hydrogen capture film 123 by dry etching, a gas containing chlorine or a gas containing fluorine, for example, can be used as described above.

Figure 2D:
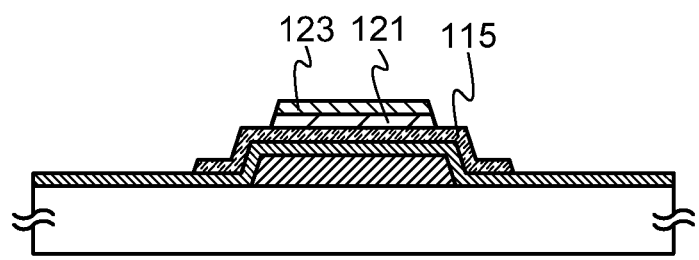

Since component materials of the oxide semiconductor film 115 in a state before the etching in this step and the hydrogen permeable film 117 are different from each other, etching rates thereof are also different from each other. Accordingly, with a condition of high etching selectivity of the hydrogen permeable film 117 to the oxide semiconductor film 115 and consideration for the end point in the oxide semiconductor film 117, the channel protective film 121 and the hydrogen capture film 123 are formed. Note that the structure obtained through the steps up to here is illustrated in FIG. 2D.

Figure 3A:
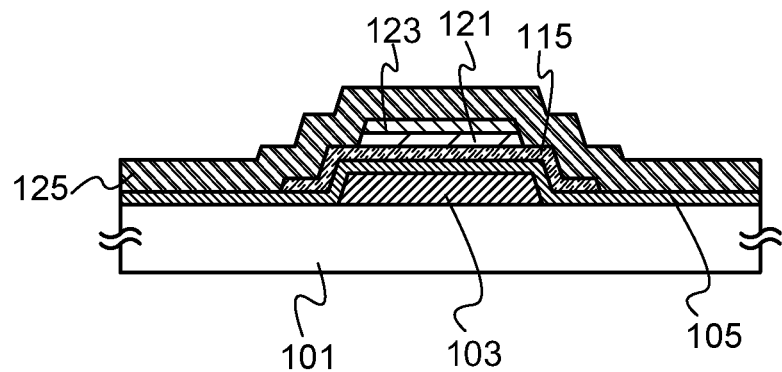
FIGS. 3A to 3C are cross-sectional views illustrating the method for manufacturing a semiconductor device which is one embodiment of the present invention.

Next, a conductive film 125 with a single layer structure or a stacked structure is formed over the gate insulating film 105, the oxide semiconductor film 115, the channel protective film 121, and the hydrogen capture film 123 (see FIG. 3A). A conductive material applicable to the gate electrode 103 is used for the conductive film 125.

A resist mask is formed over the conductive film 125 through a photolithography process. The conductive film 125 is etched into a desired shape with use of the resist mask, thereby forming a source electrode 125a and a drain electrode 125b.

After the formation of the source and drain electrodes 125a and 125b, part of the hydrogen capture film 123 may also be etched with use of the resist mask to form separated hydrogen capture films 123a and 123b. In that case, part of the channel protective film 121 is exposed by the etching. Note that the hydrogen capture films 123a and 123b may have a conductive property. In that case, the hydrogen capture film 123a and the hydrogen capture film 123b can be regarded as part of the source electrode 125a and part of the drain electrode 125b.

Since component materials of the hydrogen capture film 123 and the channel protective film 121 are different from each other, etching rates thereof are also different from each other. Accordingly, with a condition of high etching selectivity of the hydrogen capture film 123 to the channel protective film 121 and consideration for the end point in the hydrogen capture film 123, the hydrogen capture films 123a and 123b are formed.

Providing the channel protective film 121 can prevent the oxide semiconductor film 115 from being etched during formation of the source and drain electrodes 125a and 125b and the hydrogen capture films 123a and 123b. Therefore, since a defect caused by the etching is not generated in the oxide semiconductor film 115 which serves as a channel formation region of the transistor 100, the transistor 100 has favorable electric characteristics.

Note that the resist mask used for forming the source and drain electrodes 125a and 125b can be formed by an ink-jet method, a printing method, or the like as appropriate, as well as by the photolithography process. The etching for forming the source and drain electrodes 125a and 125b may be either dry etching or wet etching. The etching is preferably performed so that ends of the source and drain electrodes 125a and 125b each have a taper angle. This is because with the source and drain electrodes having a taper angle, the coverage with a film to be formed in the subsequent steps after this step in the process for manufacturing the transistor 100 can be improved and disconnection of the film can be prevented. In the case of using dry etching, the taper angle can be obtained by etching while the resist mask is reduced in size.

Figure 3B:
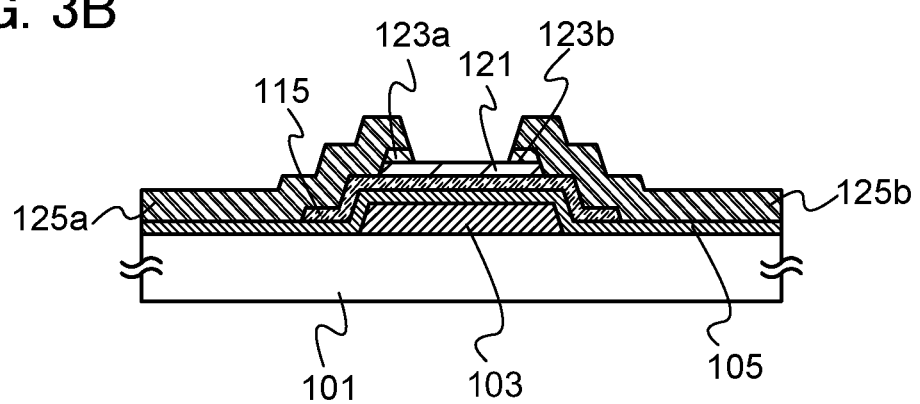

The source electrode 125a and the drain electrode 125b also have the function of a source wiring and a drain wiring, respectively. The thickness of the source electrode 125a and the drain electrode 125b can be determined as appropriate depending on the electric resistance of the conductive material for the source and drain electrodes 125a and 125b (or the conductive material for the conductive film 125) and a period of time for the manufacturing step. For example, the thickness of the source electrode 125a and the drain electrode 125b may be greater than or equal to 10 nm and less than or equal to 500 nm. The structure obtained through the steps up to here is illustrated in FIG. 3B.

Through the above steps, the transistor 100 can be manufactured.

Figure 3C:
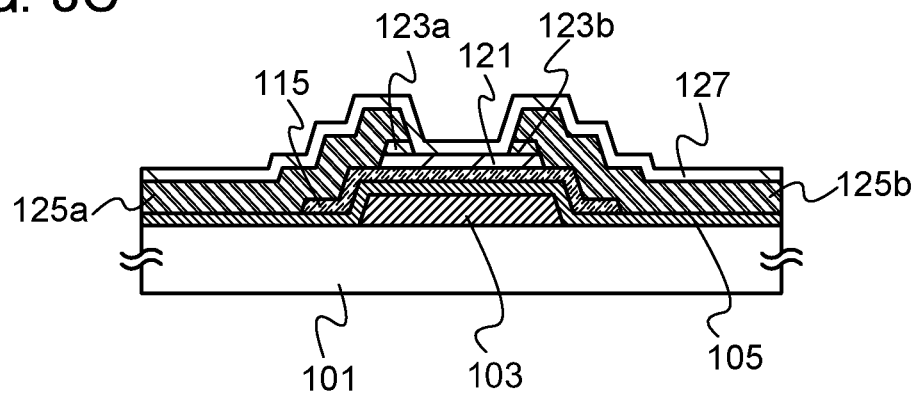

As shown in FIG. 3C, a protective insulating film 127 may be provided over the channel protective film 121, the separated hydrogen capture films 123a and 123b, and the source and drain electrodes 125a and 125b. The protective insulating film 127 may be formed using a silicon oxide film, a silicon oxynitride film, a silicon nitride oxide film, or a silicon nitride film by a sputtering method, a CVD method, or the like. At this time, it is preferable that a material from which oxygen is less likely to be released by heating be used for the protective insulating film 127. This is for prevention against a decrease in the conductivity of the oxide semiconductor film 115. Specifically, the protective insulating film 127 may be formed by a CVD method with use of a mixture which includes a silane gas as a main material and a proper source gas selected from a nitrogen oxide gas, a nitrogen gas, a hydrogen gas, and a rare gas. The substrate temperature may be set to higher than or equal to 300° C. and lower than or equal to 550° C. By a CVD method, the film from which oxygen is less likely to be released by heating can be formed.

In addition to the above heat treatment, another heat treatment may be conducted. That is, heat treatment may be performed plural times for manufacturing the transistor 100. The second or later heat treatment is performed at a temperature higher than or equal to 150° C. and lower than the strain point of the substrate, preferably higher than or equal to 250° C. and lower than or equal to 450° C., further preferably higher than or equal to 300° C. and lower than or equal to 450° C., in an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere including the oxidation gas at lower than 10 ppm and is filled with nitrogen or a rare gas. The treatment time is 3 minutes to 24 hours. Heat treatment for longer than 24 hours is not preferable because the productivity is reduced. Note that the timing of the second or later heat treatment is not limited as long as the second or later heat treatment is performed after the heat treatment for forming the oxide semiconductor film 113.

In the case of performing heat treatment plural times, the hydrogen concentration in the oxide semiconductor film 115 of the completed transistor 100 can be further reduced. Moreover, the oxygen deficiency in the oxide semiconductor film 115, the interface level between the gate insulating film 105 and the oxide semiconductor film 115, the interface level between the oxide semiconductor film 115 and the channel protective film 121 can be reduced. Thus, the transistor 100 can be a highly reliable transistor with stable electric characteristics.

Note that an apparatus applicable to the heat treatment for forming the oxide semiconductor film 113 may be used for the second or later heat treatment.

When by the heat treatment for forming the oxide semiconductor film 113, the hydrogen concentration can be sufficiently reduced to form the transistor 100 having favorable electric characteristics and the defect level in the band gap caused by the oxygen deficiency can be sufficiently reduced, the second or later heat treatment may be skipped.

An opening may be formed in the gate insulating film 105 and the protective insulating film 127 to expose the gate electrode 103 and the source and drain electrodes 125a and 125b, as necessary.

In the above manner, by the heat treatment, hydrogen in the oxide semiconductor film is released, and the hydrogen is transferred to the hydrogen capture film through the hydrogen permeable film, whereby a transistor having favorable electric characteristics can be manufactured.

Note that the structure described in this embodiment can be used in appropriate combination with any of the structures described in the other embodiments or example in this specification.

(Embodiment 2)

In this embodiment, a transistor 200 whose structure is partly different from the structure of the transistor 100 in Embodiment 1 will be described. Specifically, the transistor 200 differs from the transistor 100 only in the shape of the hydrogen capture film; therefore, reference numerals used for description of the transistor 200 are the same as those used for the description of the transistor 100 in some cases. In addition, the transistor 200 is one of modification examples of the transistor 100, so that the description in Embodiment 1 can be applied to this embodiment.

Figure 4A:
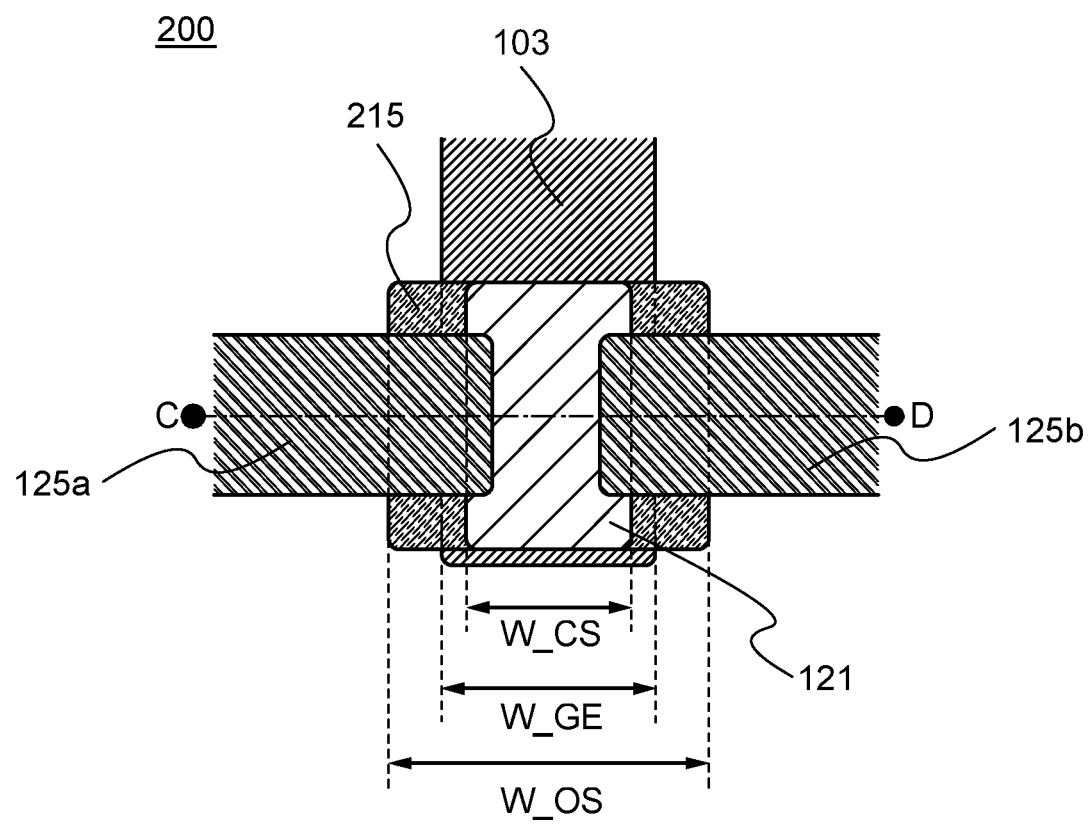
FIGS. 4A and 4B are a top view and a cross-sectional view of a semiconductor device which is one embodiment of the present invention.
Figure 4B:
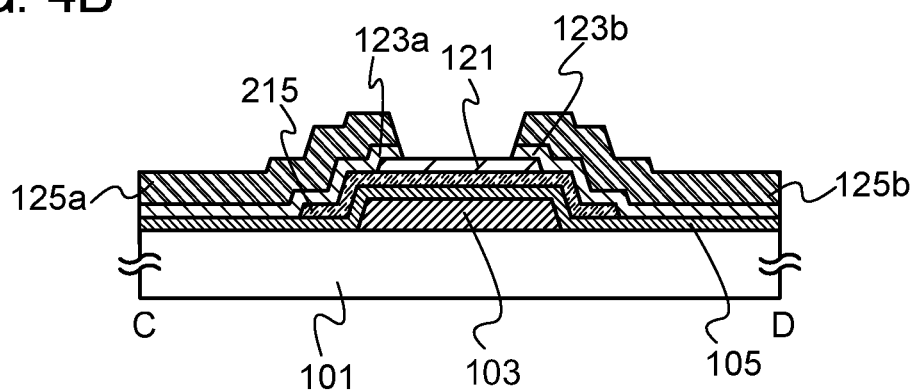

FIG. 4A is the top view of the transistor 200. FIG. 4B is the cross-sectional view taken along the alternate long and short dashed line C-D in FIG. 4A.

The transistor 200 includes the gate electrode 103 over the substrate 101, the gate insulating film 105 covering the gate electrode 103, the oxide semiconductor film 215 over the gate insulating film 105, the channel protective film 121 formed of a hydrogen permeable film over the oxide semiconductor film 215, the hydrogen capture films 123a and 123b in contact with part of the oxide semiconductor film 215, part of the channel protective film 121, and part of the gate insulating film 105, and the source electrode 125a and the drain electrode 125b over the hydrogen capture films 123a and 123b. Note that the gate insulating film 105 is not shown in FIG. 4A for clarity. Ends of the hydrogen capture films 123a and 123b have taper angles in FIG. 4B, but the taper angles of the hydrogen capture films 123a and 123b are not shown in FIG. 4A for clarity. In the transistor according to one embodiment of the present invention, in addition to the channel protective film formed over a channel formation region, an insulating film may be formed over the channel protective film to cover ends of the oxide semiconductor film.

The transistor 200 has a bottom-gate structure, in which the gate electrode 103 is provided over the substrate 101. Further, the transistor 200 has a top-contact structure, in which the source and drain electrodes 125a and 125b are provided in contact with part of a top surface of the oxide semiconductor film 115.

In the transistor 200, the shape of the hydrogen capture films 123a and 123b is the same as the shape of the source and drain electrodes 125a and 125b, which is different from the transistor 100.

Also in the transistor 200, the hydrogen capture films 123a and 123b are formed simultaneously with formation of the source and drain electrodes 125a and 125b with use of the same resist mask, so that the hydrogen capture films 123a and 123b are separately provided.

As in the description of the transistor 100, in the transistor 200, the width W_OS of the oxide semiconductor film 115 may be smaller than the width W_GE of the gate electrode 103. Such a structure can prevent exposure to light which enters from the rear surface of the substrate 101 (e.g., visible light and ultraviolet light); thus, deterioration of electric characteristics caused by irradiation of the light can be reduced in the completed transistor 200. Note that as examples of the deterioration of electric characteristics caused by irradiation of the light, negative shift of threshold voltage and an increase in off-state current are given.

The oxide semiconductor film 215 serves as a channel formation region of the transistor 200. The channel protective film 121 is provided over the oxide semiconductor film 215, so that the channel length of the transistor 200 corresponds to the width W_CS of the channel protective film 121. Providing the channel protective film 121 can prevent the oxide semiconductor film 215 from being etched during formation of the source and drain electrodes 125a and 125b. Consequently, a defect caused by such etching can be suppressed; thus, the completed transistor 200 can have favorable electric characteristics.

A method for manufacturing the transistor 200 will be described below with reference to FIGS. 5A to 5D and FIGS. 6A to 6E.

As in Embodiment 1, the gate electrode 103, the gate insulating film 105, and the oxide semiconductor film 107 are formed over the substrate 101.

Figure 5A:
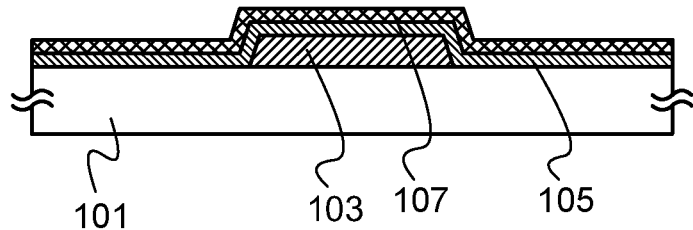
FIGS. 5A to 5D are cross-sectional views illustrating a method for manufacturing a semiconductor device which is one embodiment of the present invention.

As for materials, thicknesses, and methods for the substrate 101, the gate electrode 103, and the oxide semiconductor film 107, those in Embodiment 1 can be referred to. Note that the structure obtained through the steps up to here is illustrated in FIG. 5A.

Also in the transistor 200, an oxynitride film containing In that can be applied to the hydrogen capture film 111 to be described later may be formed between the gate electrode 103 and the gate insulating film 105. Thus, the transistor 200 can obtain the effect described in the explanation of the transistor 100.

Figure 5B:
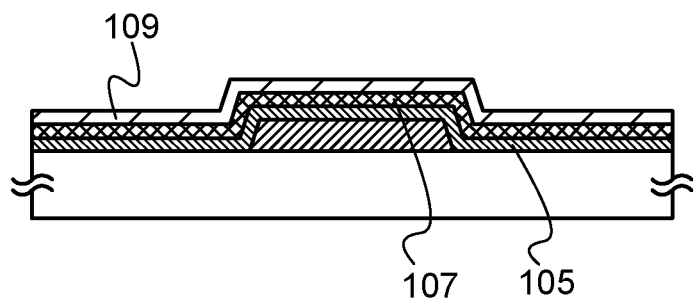

Next, the hydrogen permeable film 109, which will be processed into the channel protective film 121, is formed over the oxide semiconductor film 107 (FIG. 5B). As for a material, a thickness, and a method for the hydrogen permeable film 109, those in Embodiment 1 can be referred to.

The channel protective film 121 which is formed by processing the hydrogen permeable film 109 has the function of keeping at least a channel formation region in the oxide semiconductor film (particularly the surface of the oxide semiconductor film) clean in the process for manufacturing the transistor 200. Specifically, since the hydrogen permeable film 109 is provided over the oxide semiconductor film 107 in the process for manufacturing the transistor 200, a defect and contamination by an organic substance, which are caused by dry etching performed in the subsequent manufacturing steps after this step, can be prevented. As a result, the completed transistor 200 can have favorable electric characteristics.

Also in the process for manufacturing the transistor 200, oxygen deficiency (oxygen vacancies) occurs in the oxide semiconductor film 107. As described in Embodiment 1, part of oxygen vacancies serves as a donor, which causes generation of electrons serving as a carrier and results in an increase in conductivity of the oxide semiconductor film 107. Accordingly, semiconductor characteristics of the formed oxide semiconductor film 107 are degraded.

Thus, as in Embodiment 1, a film containing oxide is used for the hydrogen permeable film 109, whereby hydrogen can be removed from the oxide semiconductor film 107 and oxygen can be supplied to the oxide semiconductor film 107 by heat treatment which is performed later. By supplying oxygen to the oxide semiconductor film 107, oxygen deficiency in the oxide semiconductor film 107 is reduced and generation of electrons serving as a carrier is suppressed accordingly. Specifically, a silicon oxide film or a silicon oxynitride film can be used as the film containing oxide.

The gate insulating film 105, the oxide semiconductor film 107, and the hydrogen permeable film 109 may be formed successively in vacuum. For example, after impurities including hydrogen attached on surfaces of the substrate 101 and the gate electrode 103 are removed by heat treatment or plasma treatment, the gate insulating film 105 may be formed without being exposed to air and continuously, the oxide semiconductor film 107 and the hydrogen permeable film 109 may also be formed without being exposed to air. By successive film formation as the above, impurities including hydrogen attached on the surfaces of the substrate 101 and the gate electrode 103 can be reduced. In addition, in the stack of the substrate 101, the gate electrode 103, the gate insulating film 105, the oxide semiconductor film 107, and the hydrogen permeable film 109, an atmospheric component can be prevented from attaching to each interface between the layers. As a result, hydrogen released from the oxide semiconductor film 107 by heat treatment performed later can be efficiently made to diffuse (penetrate) and captured. Moreover, the completed transistor 200 can have favorable electric characteristics.

A resist mask is formed over the hydrogen permeable film 109 through a photolithography process, and the oxide semiconductor film 107 and the hydrogen permeable film 109 are etched into a desired shape with use of the resist mask, so that an oxide semiconductor film 207 and the hydrogen permeable film 117 can be formed. Note that the resist mask can be formed by an ink-jet method, a printing method, or the like as appropriate, as well as through the photolithography step. For the etching, either wet etching or dry etching may be employed, and the etching is preferably performed so that ends of the oxide semiconductor film 207 and the hydrogen permeable film 117 each have a taper angle. With the taper angle of ends of the oxide semiconductor film 207 and the hydrogen permeable film 117, in the manufacturing process of the transistor 200, coverage with a film which is formed after this etching step can be improved, and disconnection of the film can accordingly be prevented. In the case of performing dry etching, the taper angle can be formed by performing etching while the resist mask is made to recede.

In the process for manufacturing the transistor 100, heat treatment is performed to release hydrogen in the oxide semiconductor film 107 and then etching is performed. On the other hand, in the process for manufacturing the transistor 200, etching is performed before hydrogen in the oxide semiconductor film 107 is released by the heat treatment. Therefore, the hydrogen concentration in the oxide semiconductor film 207 after this etching is the same level as the hydrogen concentration in the oxide semiconductor film 107.

For example, the gas containing chlorine or fluorine given in Embodiment 1 can be used in the dry etching for forming the oxide semiconductor film 207 and the hydrogen permeable film 117.

Figure 5C:
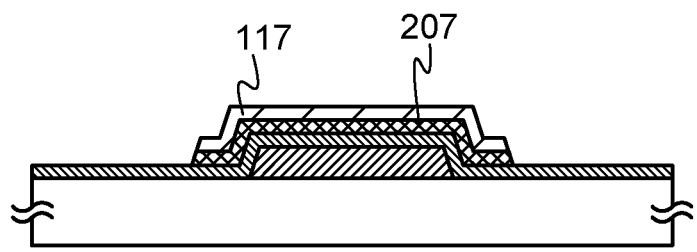

As for the etching in this step, since component materials of the oxide semiconductor film 107 in a state before the etching and the gate insulating film 105 are different from each other, etching rates thereof are also different from each other. Accordingly, with a condition of high etching selectivity of the oxide semiconductor film 107 to the gate insulating film 105 and consideration for the end point in the oxide semiconductor film 107, the oxide semiconductor film 207 and the hydrogen permeable film 117 are formed. Note that the structure obtained through the steps up to here is illustrated in FIG. 5C.

Next, a resist mask is formed over the hydrogen permeable film 117 through a photolithography process, and the hydrogen permeable film 117 is etched into a desired shape with use of the resist mask, so that the channel protective film 121 can be formed over the oxide semiconductor film 207. Note that the channel protective film 121 is formed with use of the same material as the hydrogen permeable film 117. For the etching, either wet etching or dry etching may be employed, and the etching is preferably performed so that an end of the channel protective film 121 has a taper angle. With the taper angle of an end of the channel protective film 121, in the manufacturing process of the transistor 200, coverage with a film which is formed after this etching step can be improved, and disconnection of the film can accordingly be prevented. In the case of performing dry etching, the taper angle can be formed by performing etching while the resist mask is made to recede.

For example, the gas containing chlorine or fluorine described above can be used as an etching gas used in the dry etching for forming the channel protective film 121.

Figure 5D:
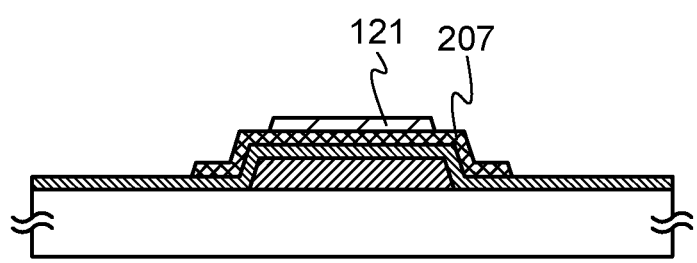

Since component materials of the oxide semiconductor film 207 in a state before the etching in this step and the hydrogen permeable film 117 are different from each other, etching rates thereof are also different from each other. Accordingly, with a condition of high etching selectivity of the hydrogen permeable film 117 to the oxide semiconductor film 207 and consideration for the end point in the oxide semiconductor film 117, the channel protective film 121 is formed. Note that the structure obtained through the steps up to here is illustrated in FIG. 5D.

Figure 6A:
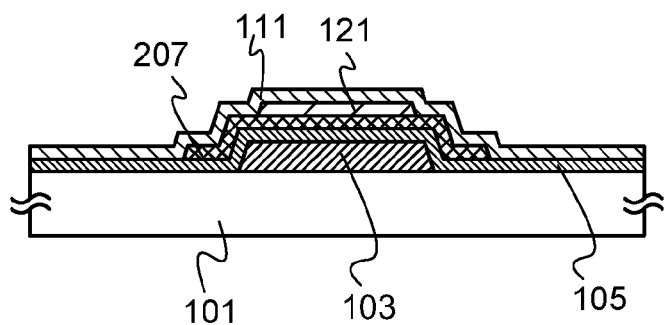
FIGS. 6A to 6E are cross-sectional views illustrating the method for manufacturing a semiconductor device which is one embodiment of the present invention.

Next, the hydrogen capture film 111 is formed over the gate insulating film 105, the oxide semiconductor film 207, and the channel protective film 121. As for a material, a thickness, and a method for the hydrogen capture film 111, those in Embodiment 1 can be referred to. The hydrogen capture film 111 has the function of capturing hydrogen which is released from the oxide semiconductor film 207 by heat treatment to be performed later and dispersed into (passes through) the channel protective film 121 (also serving as a hydrogen permeable film). There is no particular limitation on a film which is applied to the hydrogen capture film 111 as long as the film has the above function, and for example, a conductive film, an insulating film, or a semiconductor film can be used. Note that the structure obtained through the steps up to here is illustrated in FIG. 6A.

The hydrogen capture film 111 of the transistor 200 includes a region to capture hydrogen which is released from the oxide semiconductor film 207 and passes through the channel protective film 121, and a region to capture hydrogen which is released from the oxide semiconductor film 207 and does not pass through the channel protective film 121.

Figure 6B:
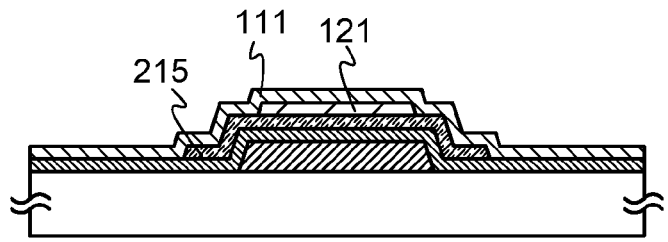

Next, heat treatment is performed on a structure obtained through the steps up to here. By performing heat treatment, hydrogen included in the oxide semiconductor film 207 can be released. The released hydrogen penetrates the channel protective film 121 and is captured by the hydrogen capture film 111. In other words, by performing the heat treatment, hydrogen included in the oxide semiconductor film 207 can be transferred to the hydrogen capture film 111. Therefore, by the heat treatment, a highly purified oxide semiconductor film 215 in which the hydrogen concentration is reduced is formed. The structure obtained through the steps up to here is illustrated in FIG. 6B.

In addition, the channel protective film 121 is formed between the oxide semiconductor film 207 and the hydrogen capture film 111, whereby the oxide semiconductor film 207 and the hydrogen capture film 111 are provided separately from each other. For example, in the case where the hydrogen capture film 111 is provided directly on the oxide semiconductor film 207, some of hydrogen released from the oxide semiconductor film 207 by heat treatment is left at an interface between the oxide semiconductor film 207 and the hydrogen capture film 111 without being captured by the hydrogen capture film 111, in some cases. However, when the channel protective film 121 is provided between the oxide semiconductor film 207 and the hydrogen capture film 111, hydrogen released from the oxide semiconductor film 207 by heat treatment can be transferred to the hydrogen capture film 111 without being left in the oxide semiconductor film 207, and accordingly the hydrogen concentration in the oxide semiconductor film 207 can be sufficiently reduced.

In the case of forming the hydrogen capture film 111 directly on the oxide semiconductor film 207, hydrogen remains at the interface between the oxide semiconductor film 207 and the hydrogen capture film 111, and the hydrogen serves as a donor, which causes an increase in off-state current of the completed transistor 100. Providing the channel protective film 121 between the oxide semiconductor film 207 and the hydrogen capture film 111 makes it possible to transfer hydrogen released from the oxide semiconductor film 207 to the hydrogen capture film 111 without remaining in the oxide semiconductor film 207 (particularly in the channel formation region). Moreover, providing the channel protective film 121 having an insulating property makes it possible to suppress an increase in off-state current of the completed transistor 200.

Embodiment 1 can be referred to for temperature and a heating apparatus employed in the heat treatment.

The hydrogen concentration of the oxide semiconductor film 215 (particularly the channel formation region) formed by the heat treatment is lower than $1\times10^{19}$ cm$^{-3}$, preferably lower than or equal to $5\times10^{18}$ cm$^{-3}$. Note that the hydrogen concentration in the oxide semiconductor film 215 is a value that can be quantified by SIMS. In the oxide semiconductor film 215, the amount of hydrogen serving as a donor is reduced, and generation of electrons serving as a carrier is suppressed; thus the oxide semiconductor film 215 has favorable semiconductor characteristics.

Since a silicon oxide film or a silicon oxynitride film is used as the channel protective film 121, by the heat treatment, oxygen is supplied to the oxide semiconductor film 215 from the silicon oxide film or the silicon oxynitride film (channel protective film 121), so that the oxygen deficiency is reduced. Further, also in this embodiment, the oxygen-excess silicon oxide film, which is an example of a film from which oxygen is released by heating, is used as the gate insulating film 105, so that oxygen is also supplied from the oxygen-excess silicon oxide film by the heat treatment, whereby the oxide semiconductor film 215 whose oxygen deficiency is reduced is formed.

In the oxide semiconductor film 215, the hydrogen concentration and the oxygen deficiency are reduced by the heat treatment; therefore, generation of electrons which serve as carriers is suppressed in the oxide semiconductor film 215. Consequently, negative shift of the threshold voltage is suppressed in the transistor 200 including the oxide semiconductor film 215, thereby achieving a transistor whose normally-on characteristics are suppressed.

Further, the interface level between the gate insulating film 105 and the oxide semiconductor film 215 and the interface level between the oxide semiconductor film 215 and the channel protective film 121 can be reduced by the heat treatment. In the thus manufactured transistor 200, charges generated in accordance with operation can be prevented from being captured at each interface. In this manner, the transistor 200 can be a transistor with less deterioration of electric characteristics.

In the case where the oxide semiconductor film 215 serving as a channel formation region of the completed transistor 200 is, similarly in Embodiment 1, a CAAC-OS film whose hydrogen concentration is reduced, the transistor 200 can be a highly reliable transistor with stable electric characteristics in which shift of threshold voltage between before and after light (visible light or ultraviolet light) irradiation and between before and after a gate bias-temperature (BT) stress test is small. Note that the range of hydrogen concentration in the oxide semiconductor film 215 is the same as that in the oxide semiconductor film 115 described in Embodiment 1.

In the oxide semiconductor film 215, hydrogen concentration is sufficiently reduced (highly purified) and enough oxygen is supplied by the heat treatment, a defect level in the energy gap caused by oxygen deficiency is reduced. As a result, the off-state current of the transistor 200 including the oxide semiconductor film 215 is reduced. Specifically, the off-state current at room temperature (25° C.) (here, the value of a transistor having a channel length of 3 μm and a channel width of 1 μm) is 100 zA (1 zA (zeptoampere) is $1\times10^{-21}$ A) or lower, preferably 10 zA or lower. Since alkali metal such as Li or Na is an impurity, the amount of the alkali metal which enters the transistor is preferably reduced. The concentration of the alkali metal in the oxide semiconductor film 215 is lower than or equal to $2\times10^{16}$ $cm^{-3}$, preferably, lower than or equal to $1\times10^{15}$ $cm^{-3}$. Further, the content of alkaline earth metal is preferably low because alkaline earth metal is also an impurity.

Figure 6C:
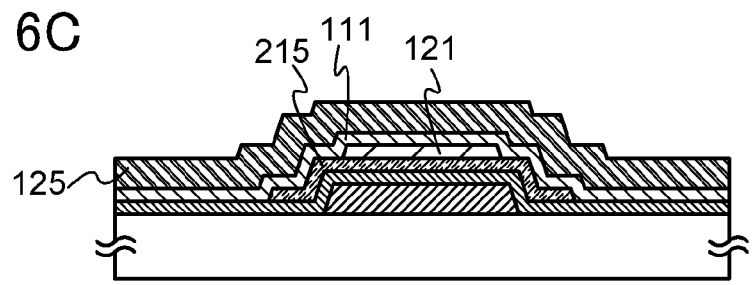

Next, the conductive film 125 with a single layer structure or a stacked structure is formed over the hydrogen capture film 111 (see FIG. 6C). A conductive material applicable to the gate electrode 103 described in Embodiment 1 is used for the conductive film 125.

A resist mask is formed over the conductive film 125 through a photolithography process. The conductive film 125 is etched into a desired shape with use of the resist mask, thereby forming a source electrode 125a and a drain electrode 125b. After the formation of the source and drain electrodes 125a and 125b, part of the hydrogen capture film 111 may also be etched with use of the resist mask to form separated hydrogen capture films 123a and 123b. In that case, part of the channel protective film 121 is exposed by the etching. Note that the hydrogen capture films 123a and 123b may have a conductive property. In that case, the hydrogen capture film 123a and the hydrogen capture film 123b can be regarded as part of the source electrode 125a and part of the drain electrode 125b.

Since component materials of the hydrogen capture film 111 and the channel protective film 121 are different from each other, etching rates thereof are also different from each other. Accordingly, with a condition of high etching selectivity of the hydrogen capture film 111 to the channel protective film 121 and consideration for the end point in the hydrogen capture film 111, the hydrogen capture films 123a and 123b are formed.

Providing the channel protective film 121 can prevent the oxide semiconductor film 215 from being etched during formation of the source and drain electrodes 125a and 125b and the hydrogen capture films 123a and 123b. Therefore, since a defect caused by the etching is not generated in the oxide semiconductor film 215 which serves as a channel formation region of the transistor 200, the transistor 200 has favorable electric characteristics.

In the case where the etching selectivity of the hydrogen capture film 111 to the oxide semiconductor film 215 cannot be sufficiently high, there is a possibility that part of the oxide semiconductor film 215 in contact with the hydrogen capture film 111 (four corners of the oxide semiconductor film 215 in FIG. 4A) disappears during the formation of the source and drain electrodes 125a and 125b or the hydrogen capture films 123a and 123b, but the oxide semiconductor film 215 of the transistor 200 may remain as shown in FIG. 4A. In order to form such a shape, a period of time for the etching is adjusted in consideration of an etching rate and a thickness of the hydrogen capture film 111.

In the transistor 200, the separated hydrogen capture films 123a and 123b are in contact with the oxide semiconductor film 215 and the source and drain electrodes 125a and 125b. In the case where the hydrogen capture films 123a and 123b which are an oxynitride film containing In have a nitrogen concentration of higher than or equal to 7 atomic % and lower than or equal to 20 atomic % (the value is quantified by an XPS method) and have a high conductivity when bonding to the captured hydrogen, the contact resistance between the oxide semiconductor film 215 and the source electrode 125a and contact resistance between the oxide semiconductor film 215 and the drain electrode 125b can be reduced, leading to an increase in on-state current of the transistor 200 by providing the hydrogen capture films 123a and 123b between the oxide semiconductor film 215 and the source and drain electrodes 125a and 125b.

The threshold voltage of the transistor 200 can be positively shifted by an electric field caused by negative charge generated from part of hydrogen captured by the hydrogen capture films 123a and 123b.

The resist mask for forming the source and drain electrodes 125a and 125b can be formed by an ink-jet method, a printing method, or the like as appropriate, as well as through the photolithography process. The etching for forming the source and drain electrodes 125a and 125b may be either dry etching or wet etching, and preferably performed so that ends of the source and drain electrodes 125a and 125b have taper angles. This is because with the source and drain electrodes 125a and 125b having a taper angle, the coverage with a film to be formed in the subsequent steps after this step in the process for manufacturing the transistor 100 can be improved and disconnection of the film can be prevented. In the case of using dry etching, the taper angle can be obtained by etching while the resist mask is reduced in size.

Figure 6D:
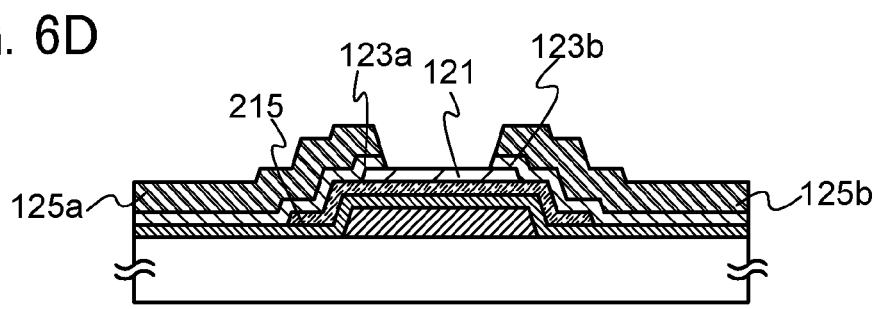

The source electrode 125a and the drain electrode 125b also have the function of a source wiring and a drain wiring, respectively. The thickness of the source electrode 125a and the drain electrode 125b can be the same as that in Embodiment 1. The structure obtained through the steps up to here is illustrated in FIG. 6D.

Through the above steps, the transistor 200 can be manufactured.

Figure 6E:
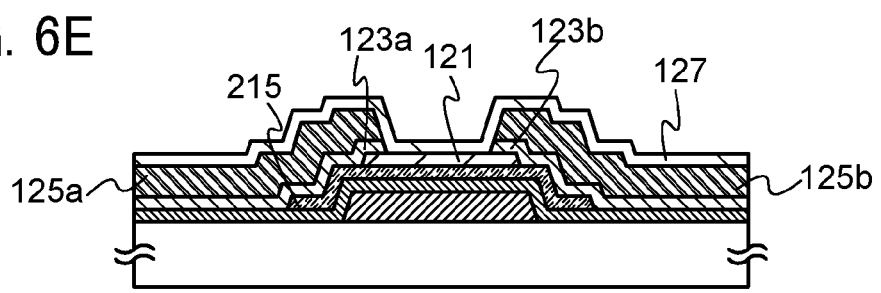

As in the transistor 100, in the transistor 200, a protective insulating film 127 may be provided over the channel protective film 121, the separated hydrogen capture films 123a and 123b, and the source and drain electrodes 125a and 125b, (see FIG. 6E). Embodiment 1 can be referred to for the protective insulating film 127.

In addition to the above heat treatment, another heat treatment may be conducted on the transistor 200, as in the description of the transistor 100. That is, heat treatment may be performed plural times for manufacturing the transistor 200. The conditions (temperature, heating atmosphere, treatment time, timing of heat treatment, and apparatus used for heat treatment) for the second or later heat treatment are the same as those in Embodiment 1.

In the case of performing heat treatment plural times, the hydrogen concentration in the oxide semiconductor film 215 of the completed transistor 200 can be further reduced. Moreover, the oxygen deficiency in the oxide semiconductor film 215, the interface level between the gate insulating film 105 and the oxide semiconductor film 215, and the interface level between the oxide semiconductor film 215 and the channel protective film 121 can be reduced. Thus, the transistor 200 can be a highly reliable transistor with stable electric characteristics.

When by the heat treatment for forming the oxide semiconductor film 207, the hydrogen concentration can be sufficiently reduced to form the transistor 100 having favorable electric characteristics and the defect level in the band gap caused by the oxygen deficiency can be sufficiently reduced, the second or later heat treatment may be skipped.

An opening may be formed in the gate insulating film 105 and the protective insulating film 127 to expose the gate electrode 103 and the source and drain electrodes 125a and 125b, as necessary.

In the above manner, by the heat treatment, hydrogen in the oxide semiconductor film is released, and the hydrogen is transferred to the hydrogen capture film through the hydrogen permeable film, whereby a transistor having favorable electric characteristics can be manufactured.

Note that the structure described in this embodiment can be used in appropriate combination with any of the structures described in the other embodiments or example in this specification.

(Embodiment 3)

In this embodiment, a liquid crystal display device manufactured with use of any of the transistors described in Embodiments 1 and 2 will be described. Note that an example in which one embodiment of the present invention is applied to a liquid crystal display device will be described in this embodiment; however, the present invention is not limited to this embodiment. For example, those skilled in the art can easily conceive an idea of applying one embodiment of the present invention to an electroluminescent (EL) display device, which is an example of a display device.

Figure 7:
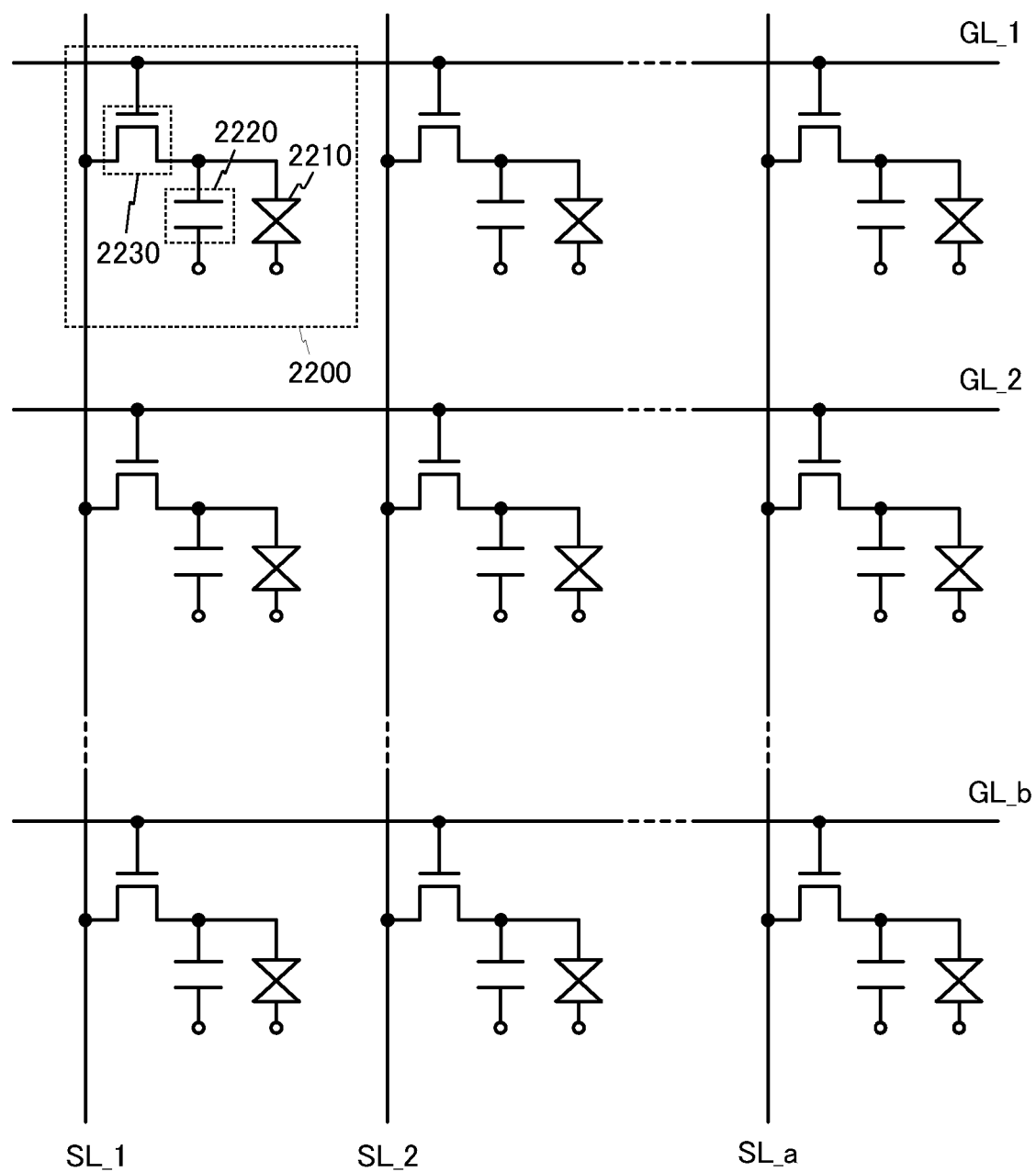
FIG. 7 is a circuit diagram illustrating an example of a liquid crystal display device including a transistor which is one embodiment of the present invention.

FIG. 7 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. The plurality of pixels 2200 with such a structure forms a pixel portion of the liquid crystal display device. Note that a "source line SL" and a "gate line GL" simply refer to a source line and a gate line, respectively, in some cases.

Any of the transistors described in Embodiments 1 and 2 is used as the transistor 2230. The transistors described in Embodiments 1 and 2 have excellent electric characteristics, such as high field effect mobility, whereby a display device with high display quality can be obtained. The transistors described in Embodiment 1 and 2 also have an extremely low off-state current, whereby a display device with low power consumption can be obtained.

The gate line GL is connected to a gate of the transistor 2230, the source line SL is connected to a source of the transistor 2230, and a drain of the transistor 2230 is connected to one capacitor electrode of the capacitor 2220 and one pixel electrode of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include any of the transistors described in Embodiments 1 and 2.

The source line SL is connected to a source driver circuit. The source driver circuit may include any of the transistors described in Embodiments 1 and 2.

Note that either the gate driver circuit or the source driver circuit or both may be formed over a separately prepared substrate and connected using a method such as chip on glass (COG), wire bonding, or tape automated bonding (TAB).

Since a transistor is easily broken by static electricity or the like, a protection circuit is preferably provided in the display device. The protection circuit is preferably formed with use of a nonlinear element.

On application of a voltage that is higher than or equal to the threshold voltage of the transistor 2230 to the gate line GL, electric charge supplied from the source line SL flows as a drain current of the transistor 2230 and is accumulated in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out.

In the case of using a transistor having a small off-state current as the transistor 2230, the period for which the voltage of the capacitor 2220 is kept can be lengthened. By this effect, the display rewriting frequency can be reduced in the case of displaying an image with little motion (including a still image); accordingly, further reduction in power consumption is possible. Further, the capacitance of the capacitor 2220 can be further reduced; accordingly, power consumed for charging can be reduced.

In the above-described manner, according to one embodiment of the present invention, a liquid crystal display device with high display quality and low power consumption can be provided.

(Embodiment 4)

In this embodiment, an example of manufacturing a semiconductor memory device with use of any of the transistors described in Embodiments 1 and 2 will be described.

Typical examples of a volatile semiconductor memory device include a dynamic random access memory (DRAM) which stores data in such a manner that a transistor included in a memory element is selected and electric charge is accumulated in a capacitor, and a static random access memory (SRAM) which holds stored data using a circuit such as a flip-flop.

As a typical example of a nonvolatile semiconductor memory device, there is a flash memory which includes a floating gate between a gate and a channel formation region in a transistor and stores data by holding electric charge in the floating gate.

Any of the transistors described in Embodiments 1 and 2 can be applied to part of transistors included in the above-described semiconductor memory device.

First, a memory cell which is a semiconductor memory device to which any of the transistors described in Embodiments 1 and 2 is applied will be described with reference to FIGS. 8A and 8B.

Figure 8A:
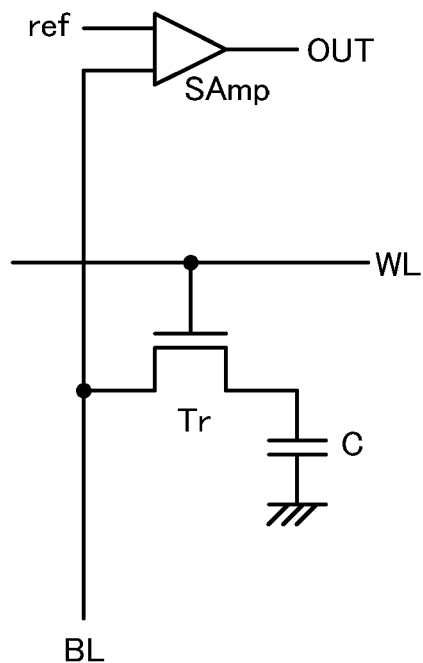
FIG. 8A is a circuit diagram illustrating an example of a semiconductor memory device which is one embodiment of the present invention and FIG. 8B is a graph showing change over time in voltage held by a capacitor.

The memory cell includes a bit line BL, a word line WL, a sense amplifier SAmp, a transistor Tr, and a capacitor C (see FIG. 8A).

Figure 8B:
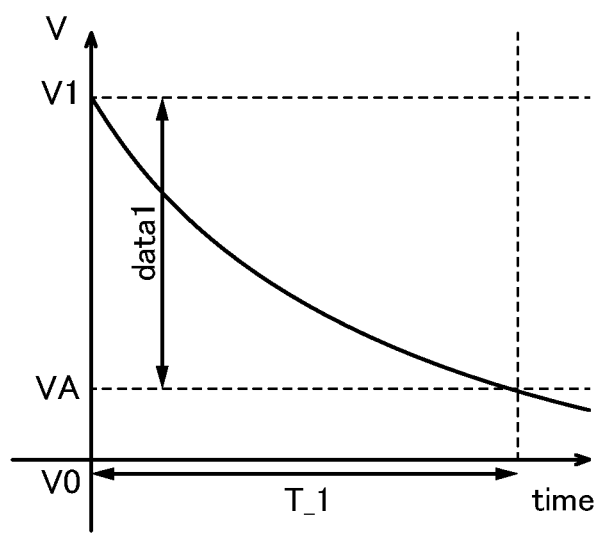

It is known that the voltage held in the capacitor C is gradually decreased with time as shown in FIG. 8B owing to the off-state current of the transistor Tr. The voltage charged from V0 to V1 is decreased to VA, which is a limit for reading out data 1, with time. This period is called holding period T_1. In the case of a two-level memory cell, refresh needs to be performed within the holding period T_1.

Since the off-state current of the transistors described in Embodiments 1 and 2 is small, if any of the transistors described in Embodiments 1 and 2 is used as the transistor Tr here, the holding period T_1 can be lengthened. That is, the period of refresh operation can be lengthened. Accordingly, power consumption can be reduced. For example, in the case where a memory cell is formed with use of a transistor including an oxide semiconductor film that is highly purified to have an off-state current of $1 \times 10^{-21}$ A or less, preferably $1 \times 10^{-24}$ A or less, data can be kept for several days to several tens of years without supply of electric power.

In the above-described manner, according to one embodiment of the present invention, a semiconductor memory device with high reliability and low power consumption can be obtained.

Next, a memory cell of a nonvolatile semiconductor memory device, to which any of the transistors described in Embodiments 1 and 2 is applied will be described with reference to FIGS. 9A and 9B.

Figure 9A:
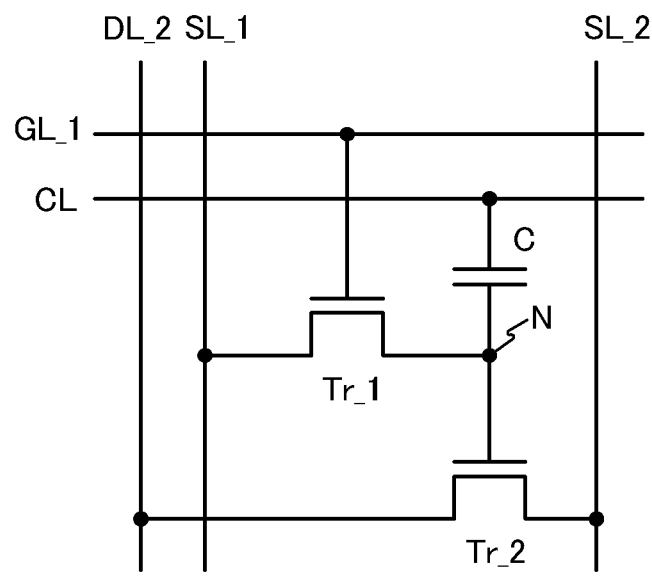
FIG. 9A is a circuit diagram illustrating an example of a semiconductor memory device which is one embodiment of the present invention and FIG. 9B is a graph showing a relation between a voltage of a capacitor wiring and a drain current flowing through a transistor.

FIG. 9A is a circuit diagram of the memory cell. A memory cell includes a transistor Tr_1, a gate line GL_1 connected to a gate of the transistor Tr_1, a source wiring SL_1 connected to a source of the transistor Tr_1, a transistor Tr_2, a source wiring SL_2 connected to a source of the transistor Tr_2, a drain wiring DL_2 connected to a drain of the transistor Tr_2, a capacitor C, a capacitor wiring CL connected to one terminal of the capacitor C, and a node N connected to the other terminal of the capacitor C, a drain of the transistor Tr_1, and a gate of the transistor Tr_2.

Figure 9B:
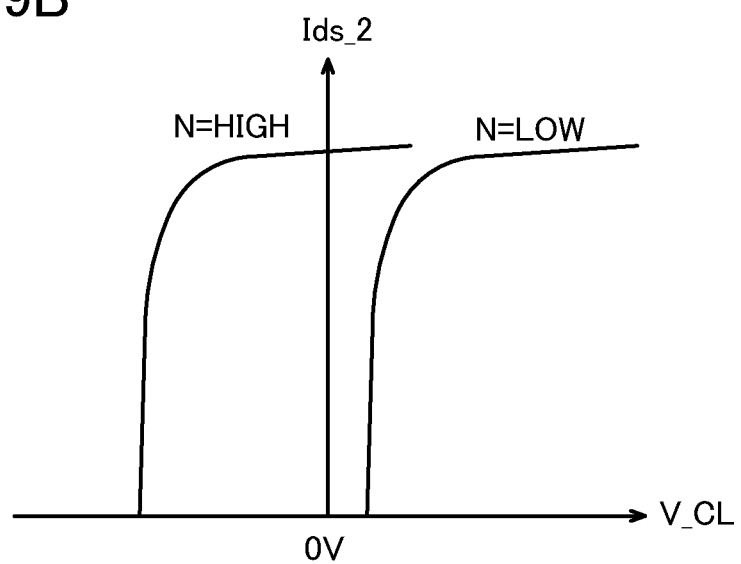

The memory cell illustrated in FIGS. 9A and 9B utilizes variation in the threshold voltage of the transistor Tr_2 in accordance with the voltage of the node N. For example, FIG. 9B shows a relation between a voltage $V_{CL}$ of the capacitor wiring CL and a drain current $I_{ds\_2}$ flowing through the transistor Tr_2.

Here, the voltage of the node N can be adjusted through the transistor Tr_1. For example, the voltage of the source line SL_1 is set to VDD. At this time, by setting the voltage of the gate line GL_1 to a voltage that is higher than or equal to the sum of the threshold voltage Vth of the transistor Tr_1 and VDD, the voltage of the node N can be set to HIGH. On the other hand, in the case where the voltage of the gate line GL_1 is set to a voltage lower than or equal to the threshold voltage Vth of the transistor Tr_1, the voltage of the node N can be set to LOW.

Thus, either a $V_{CL}$-$I_{ds\_2}$ curve for N=LOW or a $V_{CL}$-$I_{ds\_2}$ curve for N=HIGH can be obtained. That is, when N=LOW, the $I_{ds\_2}$ is small at a $V_{CL}$ of 0V; accordingly, data 0 is stored. Further, when N=HIGH, the $I_{ds\_2}$ is large at a $V_{CL}$ of 0V; accordingly, data 1 is stored. In this manner, data can be stored.

Since the off-state current of the transistors described in Embodiments 1 and 2 can be made to be extremely small, if any of the transistors described in Embodiments 1 and 2 is used as the transistor Tr_1 here, unintentional leak of electric charge accumulated in the node N through the source and the drain of the transistor Tr_1 can be suppressed. Therefore, data can be held for a long period. With use of one embodiment of the present invention, the threshold voltage of the transistor Tr_1 is adjusted, which enables reduction in the voltage necessary for writing. Thus, power consumption can be made small as compared to a flash memory or the like.

Note that any of the transistors described in Embodiments 1 and 2 may also be applied to the transistor Tr_2.

In the above manner, according to one embodiment of the present invention, a semiconductor memory device with high reliability for a long period, low power consumption, and a high degree of integration can be obtained.

This embodiment can be implemented in appropriate combination with any of the other embodiments.

(Embodiment 5)

A central processing unit (CPU) can be formed with use of any of the transistors described in Embodiments 1 and 2 for at least part of the CPU.

Figure 10A:
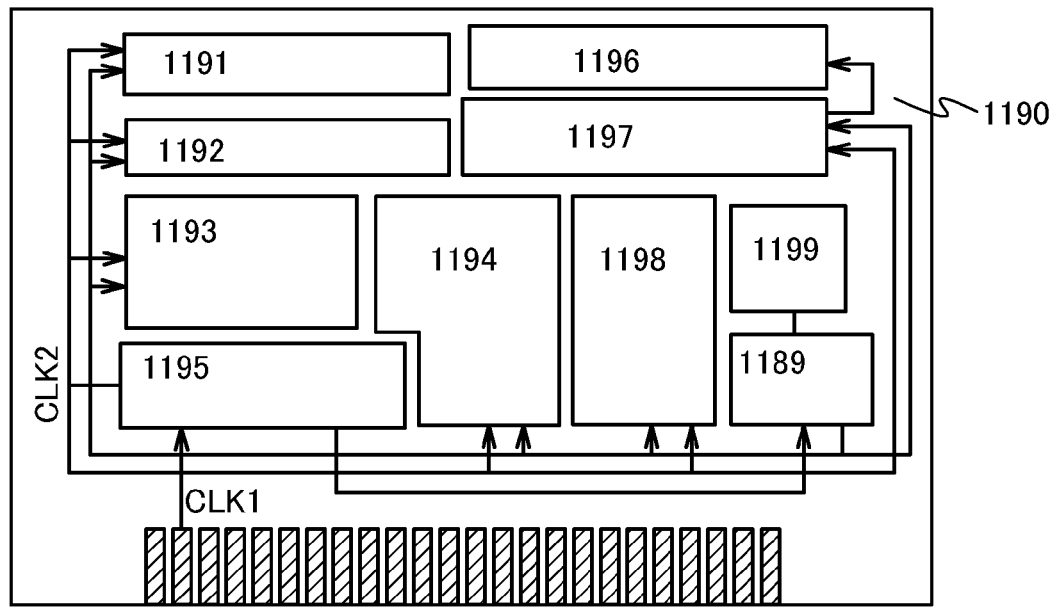
FIG. 10A is a block diagram illustrating a specific example of a CPU including a transistor which is one embodiment of the present invention and FIGS. 10B and 10C are circuit diagrams each illustrating part of the CPU.

FIG. 10A is a block diagram illustrating a specific structure of a CPU. The CPU illustrated in FIG. 10A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 10A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the clock signal CLK2 to the above circuits.

In the CPU illustrated in FIG. 10A, a memory element is provided in the register 1196. Any of the memory elements described in Embodiment 4 can be used as the memory element provided in the register 1196.

In the CPU illustrated in FIG. 10A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 10B:
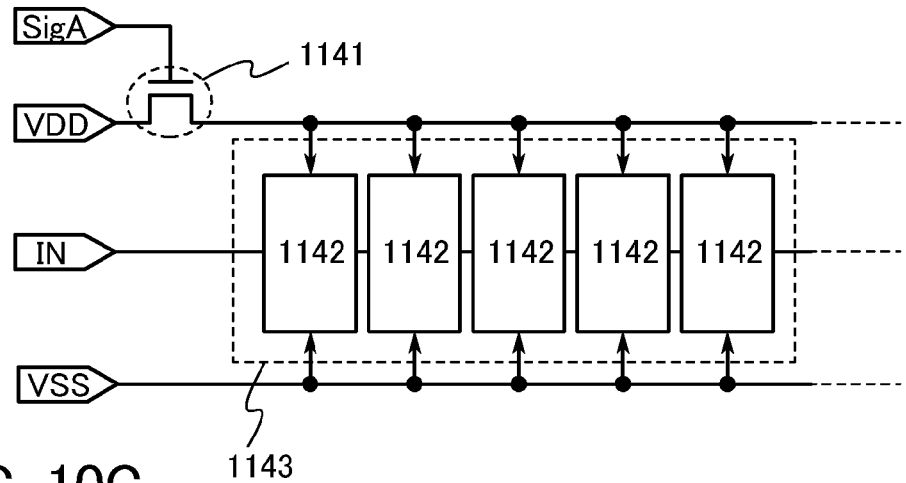
Figure 10C:
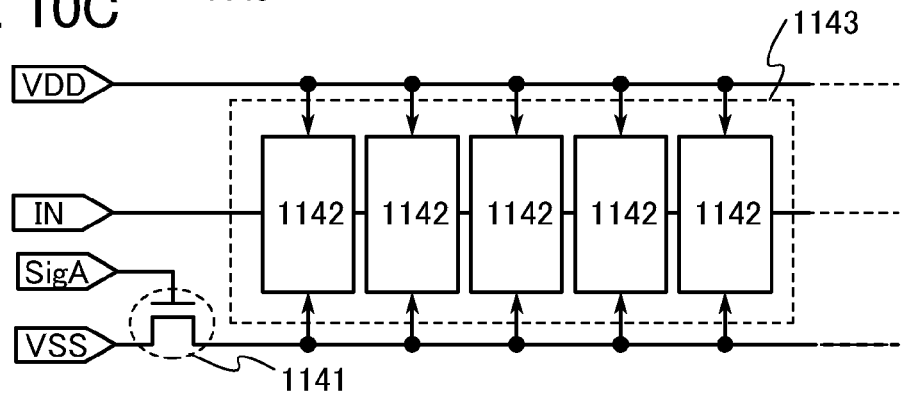

The power supply can be stopped by providing a switching element between a memory element group and a node to which a high-level power supply potential VDD or a low-level power supply potential VSS is supplied, as illustrated in FIG. 10B or FIG. 10C. Circuits illustrated in FIGS. 10B and 10C will be described below.

FIGS. 10B and 10C each illustrate an example of a structure of a memory circuit including, as a switching element for controlling supply of a power supply potential to a memory element, a transistor in which an oxide semiconductor is used for an active layer.

The memory device illustrated in FIG. 10B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 10B, as the switching element 1141, a transistor in which a semiconductor with a wide band gap such as an oxide semiconductor is used for an active layer is used, and the switching of the transistor is controlled by a signal SigA supplied to a gate electrode thereof.

Note that FIG. 10B illustrates the structure in which the switching element 1141 includes only one transistor; however, without limitation thereto, the switching element 1141 may include a plurality of transistors. In the case where the switching element 1141 includes a plurality of transistors each serving as a switching element, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 10B, the switching element 1141 may control the supply of the low-level power supply potential VSS.

FIG. 10C illustrates an example of a memory device in which each of the memory elements 1142 included in the memory element group 1143 is supplied with the low-level power supply potential VSS via the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the above embodiments.

(Embodiment 6)

Any of the semiconductor devices disclosed in this specification can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable digital assistance, an audio reproducing device, and a large-sized game machine such as a pachinko machine.

Figure 11A:
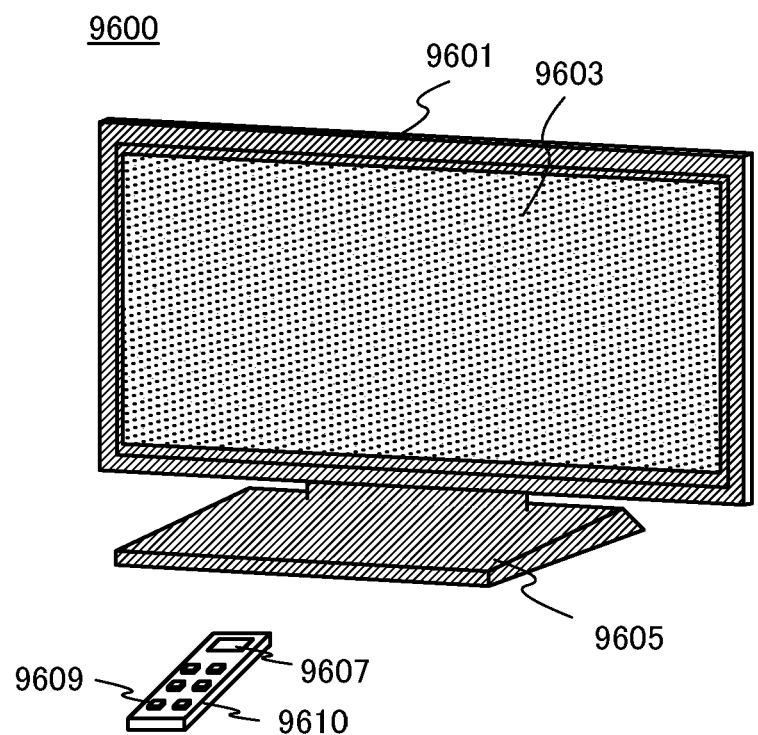
FIG. 11A is an external view illustrating an example of a television device and FIG. 11B is an external view illustrating an example of a digital photo frame.

FIG. 11A illustrates an example of a television set. In a television set 9600, a display portion 9603 is incorporated in a housing 9601. The display portion 9603 can display images. Further, the housing 9601 is supported by a stand 9605 in FIG. 11A. One embodiment of the present invention can be applied to the display portion 9603. With use of one embodiment of the present invention, a television set with low power consumption can be achieved even when the size of the display portion 9603 is increased.

The television set 9600 can be operated with an operation switch of the housing 9601 or a separate remote controller 9610. Channels and volume can be controlled with operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 11B:
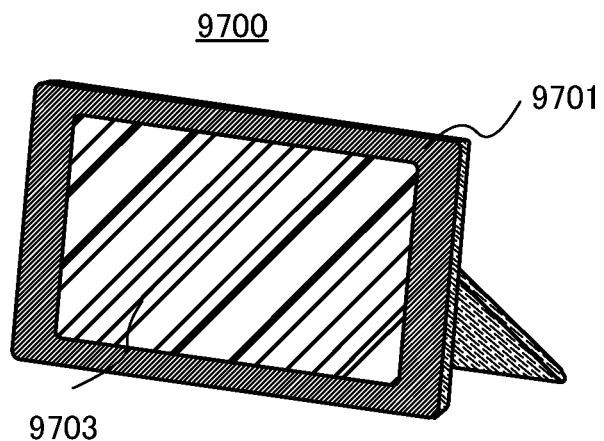

FIG. 11B illustrates an example of a digital photo frame. For example, in a digital photo frame 9700, a display portion 9703 is incorporated in a housing 9701. One embodiment of the present invention can be applied to the display portion 9703. With use of one embodiment of the present invention, a digital photo frame with low power consumption can be achieved even when the size of the display portion 9703 is increased. The display portion 9703 can display a variety of images. For example, the display portion 9703 can display data of an image taken with a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the rear surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

This embodiment can be implemented in appropriate combination with any of the above embodiments.

EXAMPLE 1

In this example, formation of an oxide semiconductor film and evaluation results of the hydrogen concentration in the oxide semiconductor film will be described. Note that the oxide semiconductor film is called Sample A in this example.

First, a method for forming Sample A will be described.

A quartz substrate was prepared, and a 300-nm-thick oxide semiconductor film was formed over the quartz substrate by a sputtering method. In this example, an IGZO film was formed as the oxide semiconductor film. The conditions for forming the IGZO film were as follows: an argon gas of 30 sccm and an oxygen gas of 15 sccm were supplied to a reaction chamber of a sputtering apparatus; the pressure in the reaction chamber was set to 0.4 Pa; the electric power was set to 0.5 kW; the substrate temperature was set to 200° C.; and a target having a composition ratio of $In_2O_3:Ga_2O_3:ZnO=1:1:2$ [molar ratio] was used. Note that the IGZO film formed under the conditions is a CAAC film.

Next, a 5 nm-thick silicon oxide film, which is a hydrogen permeable film, was formed over the oxide semiconductor film by a sputtering method. The conditions for forming the silicon oxide film were as follows: an argon gas of 25 sccm and an oxygen gas of 25 sccm were supplied to a reaction chamber of a sputtering apparatus, the pressure in the reaction chamber was set to 0.4 Pa; the electric power was set to 1.0 kW; the substrate temperature was set to 100° C.; a $SiO_2$ target was used.

Then, a 300-nm-thick oxynitride film, which is a hydrogen capture film, was formed over the hydrogen permeable film by a sputtering method. In this example, an IGZON film was formed as the oxynitride film. The conditions for forming the IGZON film were as follows: a nitrogen gas of 40 sccm was supplied to a reaction chamber of a sputtering apparatus, the pressure in the reaction chamber was set to 0.4 Pa; the electric power was set to 0.5 kW; the substrate temperature was set to 200° C.; and a target having a composition ratio of $In_2O_3:Ga_2O_3:ZnO=1:1:2$ [molar ratio] was used.

Next, heat treatment was performed on an object obtained through the steps up to here. The heat treatment was performed at a temperature of 550° C. under a nitrogen atmosphere for one hour. The object which had been subjected to the heat treatment was called Sample A and another object which had not been subjected to the heat treatment was called comparative example. The comparative example is a sample formed by the same process as Sample A except for the heat treatment.

Figure 12:
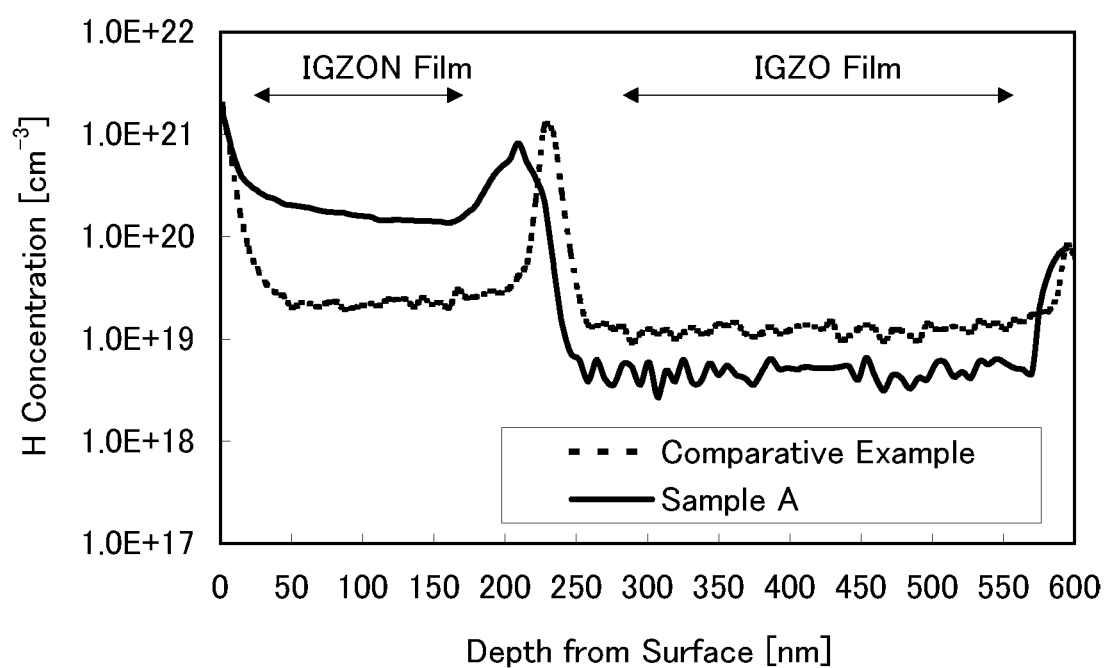
FIG. 12 is a diagram showing a profile of the nitrogen concentration in an oxide semiconductor film.

The hydrogen concentration in Sample A was evaluated by SIMS and the results are shown in FIG. 12. In FIG. 12, the vertical axis indicates the hydrogen concentration in Sample A and the comparative example, and the horizontal axis indicates the depth from surfaces (IGZON film surfaces) of Sample A and the comparative example to the substrate. The solid line represents a profile of the hydrogen concentration in Sample A, and the broken line represents a profile of the hydrogen concentration in the comparative example. In each of Sample A and the comparative example, a highly reliable value of the hydrogen concentration in the IGZO film is in a range of 300 nm to 550 nm in the horizontal axis, and a highly reliable value of the hydrogen concentration in the IGZON film is in a range of 50 nm to 150 nm in the horizontal axis. A peak in a range of 200 nm to 250 nm in the horizontal axis is generated due to a small thickness (5 nm) of the silicon oxide film. The reliability of values of hydrogen concentration in this range is low. Values of the hydrogen concentration around 600 nm in the horizontal axis are due to the quartz substrate.

According to FIG. 12, it is confirmed that in the range corresponding to the IGZO film, the hydrogen concentration in Sample A is lower than that in the comparative example; in the range corresponding to the IGZON film, the hydrogen concentration in Sample A is higher than that in the comparative example.

In the case where a silicon oxide film and an IGZON film are formed over an IGZO film and then subjected to heat treatment in the above manner, it was confirmed that hydrogen in the IGZO film is released, passes through the silicon oxide film, and is captured by the IGZON film.

According to this example, the following was confirmed: by a process including steps of forming a hydrogen permeable film over an oxide semiconductor film, forming a hydrogen capture film over the hydrogen permeable film, and performing heat treatment, hydrogen can be released from the oxide semiconductor film and can be captured by the hydrogen capture film; therefore, an oxide semiconductor film with a low hydrogen concentration can be formed.

This application is based on Japanese Patent Application serial no. 2011-067498 filed with Japan Patent Office on Mar. 25, 2011, the entire contents of which are hereby incorporated by reference.

What is claimed is:

1. A semiconductor device comprising:
   a gate electrode;
   a gate insulating film over the gate electrode;
   an oxide semiconductor film over the gate insulating film;
   a channel protective film having a hydrogen permeable property over the oxide semiconductor film;
   a film having a hydrogen capture property in contact with a part of the channel protective film, a part of the oxide semiconductor film, and a part of the gate insulating film; and
   a source electrode and a drain electrode over and in direct contact with an upper surface of the film having a hydrogen capture property.

2. The semiconductor device according to claim 1, wherein the channel protective film contains an oxide.

3. The semiconductor device according to claim 1,
   wherein a metal element included in the film having a hydrogen capture property as a main component and a metal element included in the oxide semiconductor film as a main component are the same, and
   wherein the channel protective film does not include the metal element as a main component.

4. The semiconductor device according to claim 1,
   wherein the channel protective film comprises a silicon oxide film or a silicon oxynitride film, and
   wherein the film having a hydrogen capture property comprises an oxynitride film containing indium.

5. The semiconductor device according to claim 4,
   wherein the oxide semiconductor film is an In—Ga—Zn—O film, and wherein the oxynitride film containing indium is an In—Ga—Zn—O—N film.

6. The semiconductor device according to claim 4, wherein a thickness of the silicon oxide film or the silicon oxynitride film is less than or equal to 5 nm.

7. A semiconductor device comprising:
a gate electrode;
a gate insulating film over the gate electrode;
an oxide semiconductor film over the gate insulating film;
a first film comprising silicon oxide or silicon oxynitride over the oxide semiconductor film;
a second oxynitride film comprising indium and one or more element selected from the group consisting of gallium, zinc, tin, aluminum, tungsten, molybdenum, titanium, tantalum, and silicon in contact with a part of the first film, a part of the oxide semiconductor film, and a part of the gate insulating film; and
a source electrode and a drain electrode over and in direct contact with an upper surface of the second oxynitride film.

8. The semiconductor device according to claim 7,
wherein a metal element included in the second oxynitride film as a main component and a metal element included in the oxide semiconductor film as a main component are the same, and
wherein the first film does not include the metal element as a main component.

9. The semiconductor device according to claim 7,
wherein the oxide semiconductor film is an In—Ga—Zn—O film, and
wherein the second oxynitride film is an In—Ga—Zn—O—N film.

10. The semiconductor device according to claim 7, wherein a thickness of the first film is less than or equal to 5 nm.

11. The semiconductor device according to claim 1, wherein a nitrogen concentration in the film having a hydrogen capture property is higher than or equal to 7 atomic % and lower than or equal to 20 atomic %.

12. The semiconductor device according to claim 7, wherein a nitrogen concentration in the second oxynitride film is higher than or equal to 7 atomic % and lower than or equal to 20 atomic %.

13. The semiconductor device according to claim 1, wherein the oxide semiconductor film is a c-axis aligned crystalline oxide semiconductor film.

14. The semiconductor device according to claim 7, wherein the oxide semiconductor film is a c-axis aligned crystalline oxide semiconductor film.

* * * * *